United States Patent
Sumi

[19]

[11] Patent Number: 6,100,767
[45] Date of Patent: Aug. 8, 2000

[54] PHASE-LOCKED LOOP WITH IMPROVED TRADE-OFF BETWEEN LOCK-UP TIME AND POWER DISSIPATION

[75] Inventor: Yasuaki Sumi, Tottori, Japan

[73] Assignees: Sanyo Electric Co., Ltd., Osaka-fu; Tottori Sanyo Electric Co., Ltd., Tottori-ken, both of Japan

[21] Appl. No.: 09/162,094

[22] Filed: Sep. 28, 1998

[30] Foreign Application Priority Data

| | | | |
|---|---|---|---|
| Sep. 29, 1997 | [JP] | Japan | 9-263980 |
| Sep. 29, 1997 | [JP] | Japan | 9-264469 |
| Jul. 17, 1998 | [JP] | Japan | 10-202947 |
| Jul. 31, 1998 | [JP] | Japan | 10-217839 |
| Jul. 31, 1998 | [JP] | Japan | 10-217840 |

[51] Int. Cl.[7] .............................. H03L 7/085; H03L 7/087
[52] U.S. Cl. ................................. 331/11; 331/14; 331/17; 331/25
[58] Field of Search .................................. 331/14, 17, 11, 331/12, 25

[56] References Cited

U.S. PATENT DOCUMENTS

| | | | |
|---|---|---|---|
| 4,280,104 | 7/1981 | Rzeszewski | 331/1 A |
| 4,803,705 | 2/1989 | Gillingham et al. | 375/120 |
| 5,254,959 | 10/1993 | Wünsch | 331/12 |
| 5,410,571 | 4/1995 | Yonekawa et al. | 375/376 |
| 5,521,948 | 5/1996 | Takeuchi | 375/376 |
| 5,530,406 | 6/1996 | Fernandez Duran et al. | 331/12 |
| 5,729,179 | 3/1998 | Sumi | 331/12 |
| 5,982,239 | 11/1999 | Takahashi et al. | 331/11 |

FOREIGN PATENT DOCUMENTS

| | | |
|---|---|---|
| 0 526 227 A2 | 2/1993 | European Pat. Off. . |
| 0 645 891 A1 | 3/1995 | European Pat. Off. . |
| 0 766 403 A1 | 4/1997 | European Pat. Off. . |
| 06069794 | 3/1994 | Japan . |
| 10-135822 | 5/1998 | Japan . |

OTHER PUBLICATIONS

Ozawa, "PLL Shuhasu Shinsesaiza—Kairo Sekkeiho (PLL Frequency Synthesizers—Circuit Design Methods)", Sogo Denshi Shuppan, pp. 74–75 and 125–131 (1994).

Yasuaki Sumi, et al. "Development of an AM/FM Frequency Synthesizer Radio Receiver," *Sanyo Technical Review*, vol. 10, No. 1, pp. 26–32 (Feb. 1978).

Yasuaki Sumi, et al. "PLL Frequency Synthesizer Using Multi-Phase Detector," *Papers of Technical Meeting on Electronic Circuts, IEE Japan*, pp. 77–82 (Jan. 16, 1997).

*Primary Examiner*—Siegfried H. Grimm
*Attorney, Agent, or Firm*—Akin, Gump, Strauss, Hauer & Feld, L.L.P.

[57] ABSTRACT

In a phase-locked loop with reference, feedback, and error signals, the trade-off between lock-up time and power dissipation is improved by one of the following methods: supplying a continuous error signal, instead of an intermittent error signal, to a charge pump during lock acquisition; employing a half-integer frequency divider and making multiple phase-and-frequency comparisons during each reference signal cycle; employing a prescaled feedback signal and making multiple phase-and-frequency comparisons during each reference signal cycle; providing multiple feedback loops and employing a selectable number of the loops during lock acquisition; and employing multiple feedback loops with prescaling of the reference and feedback signals.

17 Claims, 16 Drawing Sheets

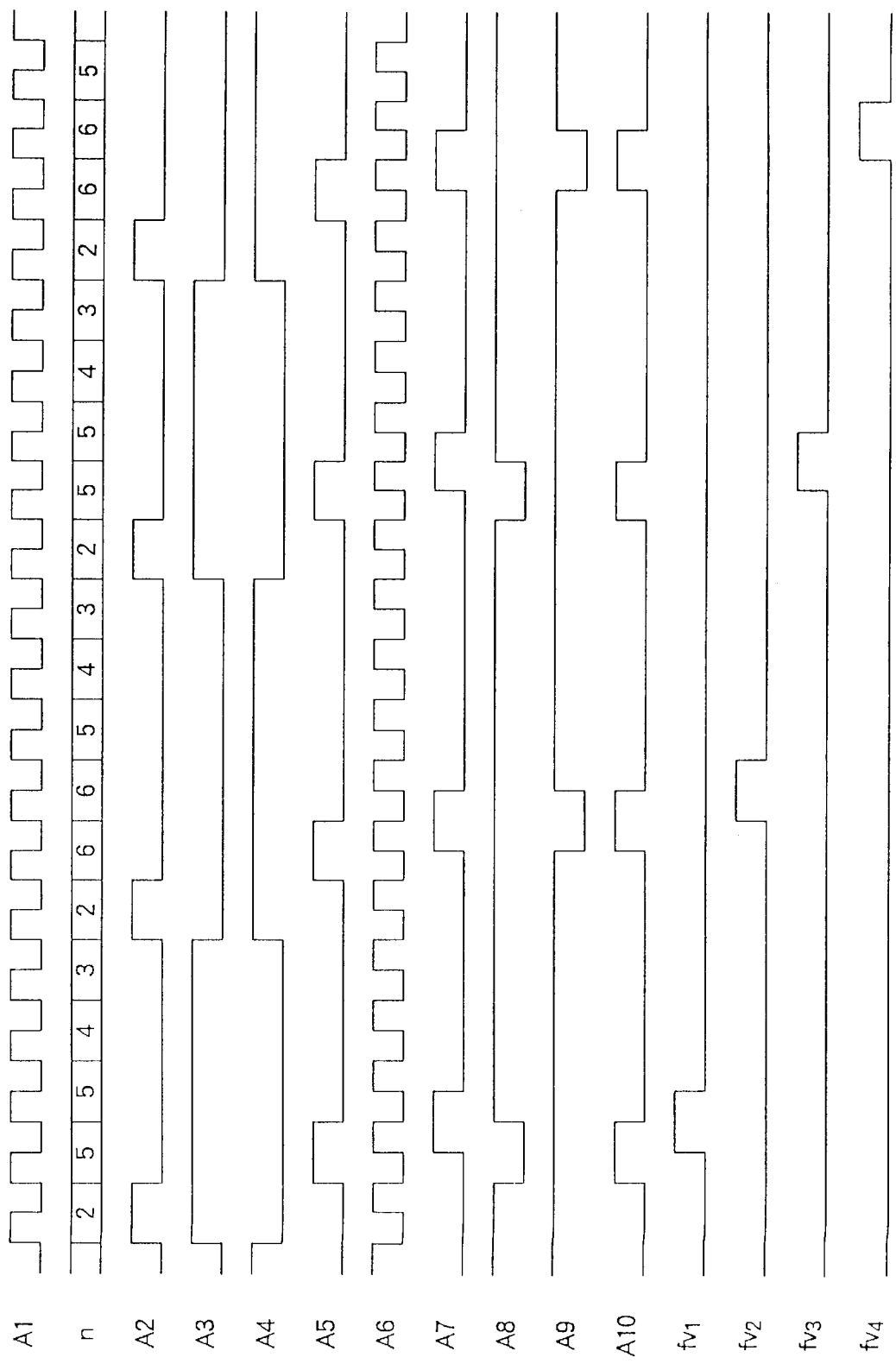

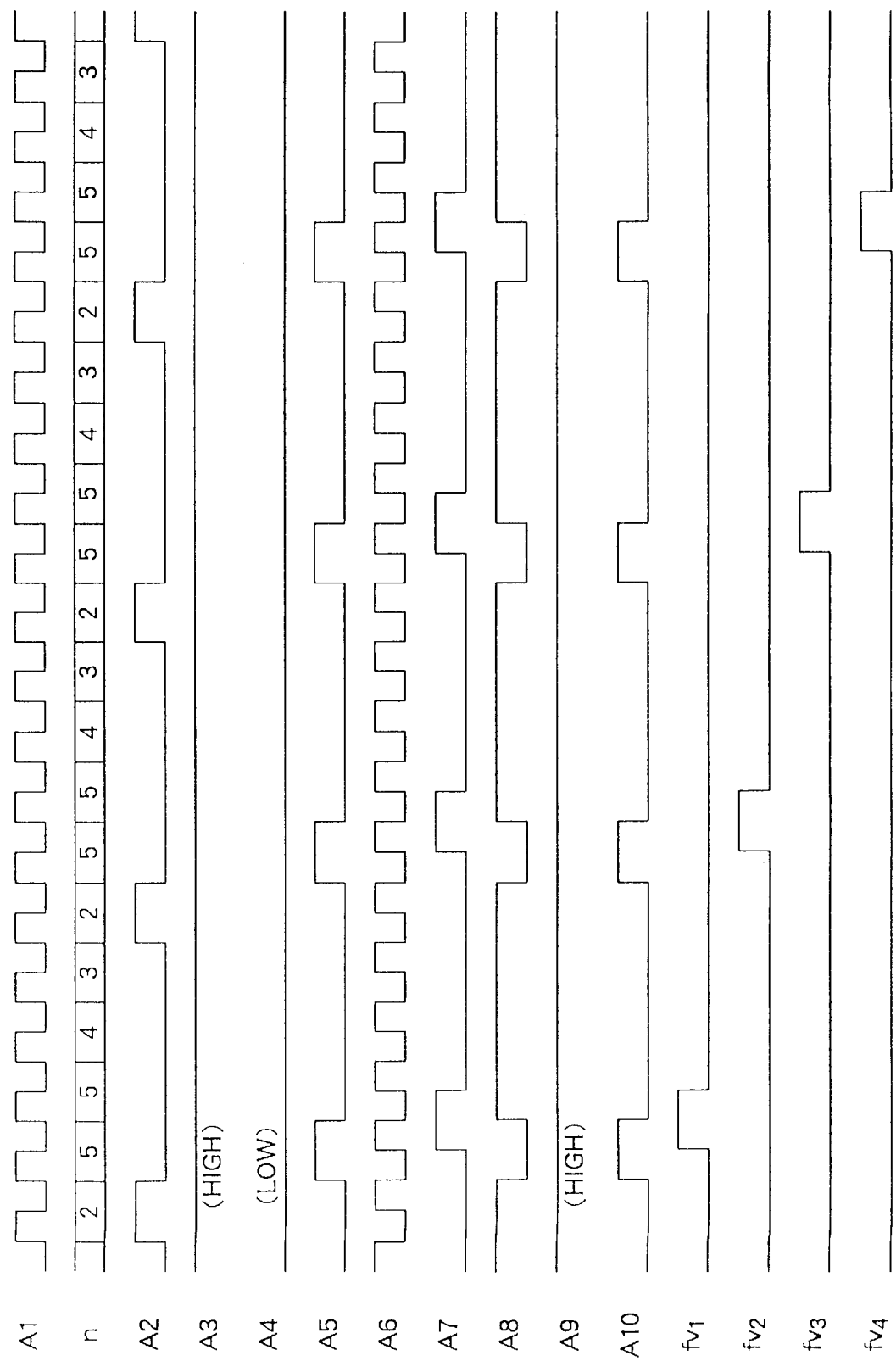

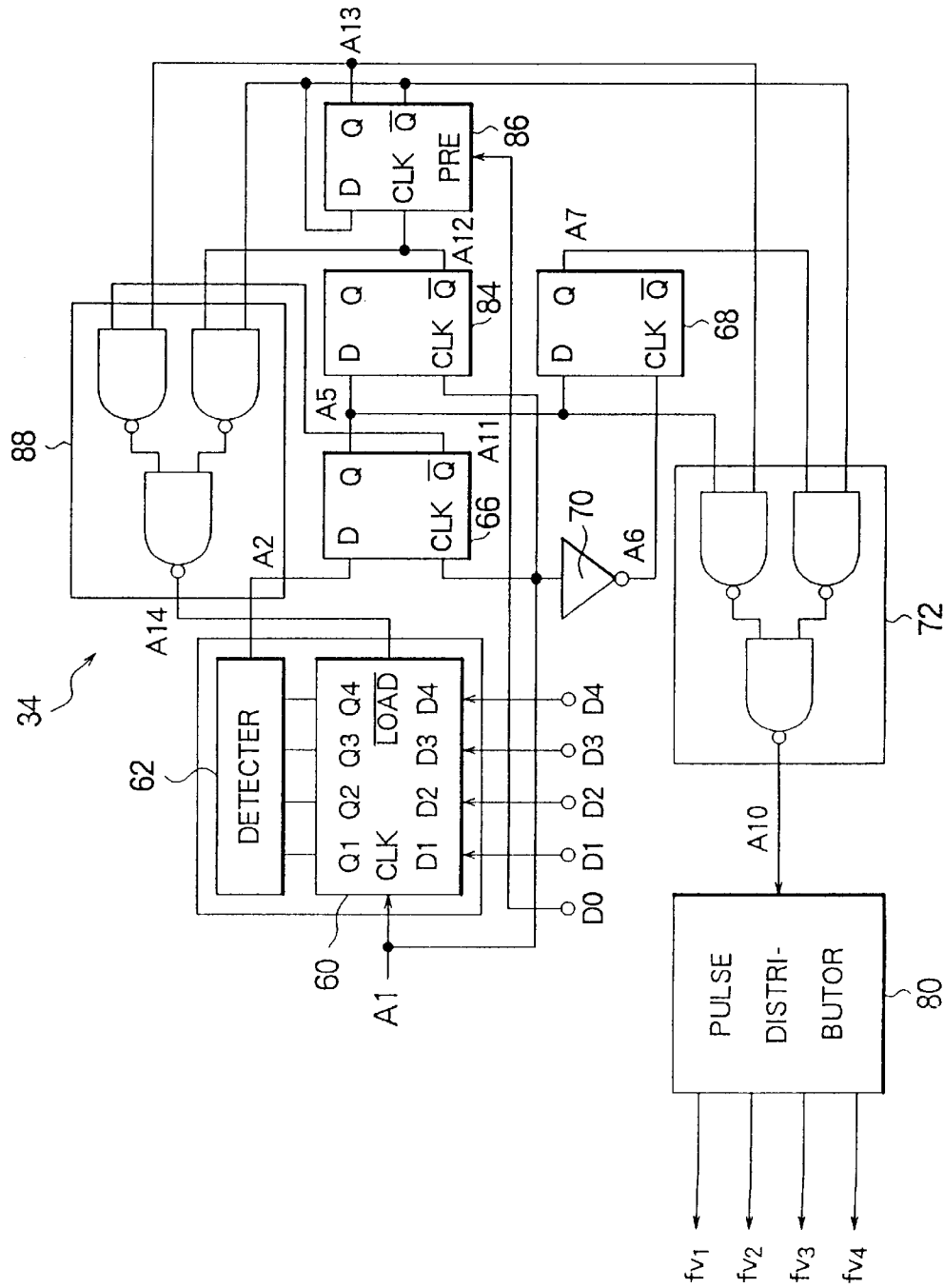

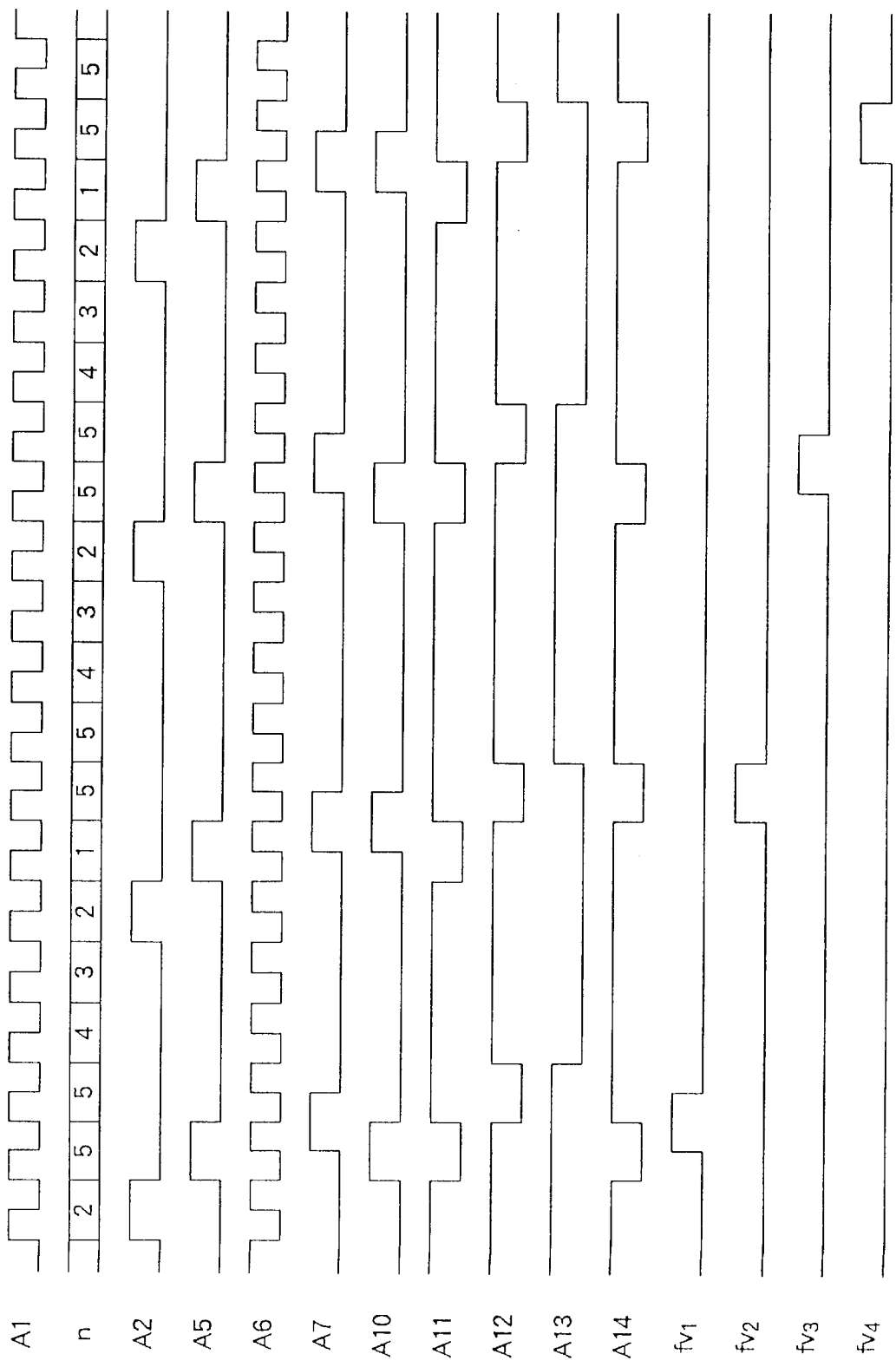

PHASE-LOCKED LOOP WITH IMPROVED TRADE-OFF BETWEEN LOCK-UP TIME AND POWER DISSIPATION

BACKGROUND OF THE INVENTION

The present invention relates to a phase-locked loop combining rapid lock acquisition with low power dissipation.

Phase-locked loops (PLLs) are widely used as frequency synthesizers in radio receivers and wireless telephone sets.

A conventional PLL comprises a reference oscillator, a voltage-controlled oscillator, a programmable frequency divider, a phase detector, and a low-pass filter. Various types of phase detectors are known, including phase detectors employing charge pumps.

A desirable capability in a PLL is the capability to lock onto new frequencies quickly. In certain types of wireless telephone sets, for example, the PLL needs to switch rapidly between the frequency of a traffic channel and the frequency of a control channel. Rapid frequency switching is also useful in radio receivers, for quick response to input from channel selection buttons.

In a conventional PLL, however, the lock acquisition time or lock-up time is determined by parameters such as the loop gain, the time constant of the low-pass filter, and the reference frequency, which is normally equal to or less than the channel spacing. When parameters that give optimum performance in the locked state are selected, the lock-up time tends to be undesirably long. In PLLs with charge-pump phase detectors, a particular problem is that the phase detector generates error signals only intermittently.

The lock-up time can be shortened by increasing the reference frequency to a value exceeding the channel spacing, but complex compensation circuitry then becomes necessary to receive channels with frequencies that are not integer multiples of the reference frequency.

Unexamined Japanese Patent Publication No. 69794/1994 discloses a PLL that accelerates the acquisition of phase lock by generating a reset signal when the desired frequency is reached, but this reset signal does not shorten the time required to reach the desired frequency.

The present inventor has proposed a PLL with multiple feedback loops, which shorten the entire lock-up process by increasing the loop gain, but these multiple feedback loops also increase the power dissipation of the PLL.

Much of the power dissipated in a PLL is dissipated by the programmable frequency divider, which has a complex internal structure and operates at the same high frequency as the voltage-controlled oscillator. Complementary metaloxide-semiconductor (CMOS) circuitry is commonly employed in the programmable frequency divider; power is dissipated by the rapid charging and discharging of a large number of capacitive loads in the CMOS circuits.

A known method of reducing power dissipation is to prescale the signals output from the reference oscillator and input to the programmable frequency divider, but this method causes a proportionate lengthening of the lock-up time.

In general, there is a trade-off between power dissipation and lock-up time in a PLL, one of these two characteristics being improved only at the expense of the other characteristic.

SUMMARY OF THE INVENTION

It is accordingly an object of the present invention to reduce the lock-up time of a PLL without increasing the power dissipation.

Another object of the invention is to reduce the power dissipation of a PLL without increasing the lock-up time.

A PLL according to a first aspect of the invention has a phase detector, a frequency divider, a detection circuit, and a control circuit. The frequency divider divides the output signal of the PLL by a predetermined frequency division ratio. The detection circuit detects when the frequency division ratio reaches the predetermined value. The control circuit outputs a fixed pump-up signal or pumpdown signal during the interval while the frequency division ratio has not reached the predetermined value.

A PLL according to a second aspect of the invention is a PLL frequency synthesizer having a frequency divider that generates a feedback signal by dividing the output signal of the PLL by a frequency division ratio of N or N+½. A first phase detector compares the phase of the feedback signal with the phase of a reference signal at a first timing, and generates a first error signal. A second phase detector compares the phase of the feedback signal and the phase of the reference signal at a second timing, and generates a second error signal. The output signal of the PLL is generated by a voltage-controlled oscillator according to the first and second error signals.

A PLL according to a third aspect of the invention has a reference signal generator, an oscillator, a prescaler dividing the oscillator output frequency by a fixed ratio, and a frequency divider dividing the prescaler output frequency by a programmable ratio, thereby generating a feedback signal. A phase detector controls the oscillator frequency by comparing the feedback signal with at least two internal reference signals having different phases, both internal reference signals being generated from the output of the reference signal generator.

A PLL according to a fourth aspect of the invention has an oscillator, a reference signal generator generating a plurality of reference signals, a frequency divider unit generating a plurality of feedback signals from the oscillator output signal, and a plurality of phase detectors that compare the feedback signals with the reference signals, thereby generating error signals that control the oscillator frequency. When the desired frequency is changed, a control unit enables a selectable number of the phase detectors, the number depending on the size of the frequency change.

A PLL according to a fifth aspect of the invention comprises an oscillator, a reference signal generator generating first and second reference signals, a frequency divider unit generating first and second feedback signals, and first and second phase detectors comparing the reference signals with the feedback signals. A prescaler is inserted between the oscillator and the frequency divider unit.

BRIEF DESCRIPTION OF THE DRAWINGS

In the attached drawings:

FIG. 4 is a waveform diagram illustrating the operation of the programmable frequency divider in FIG. 3A;

FIG. 5 is another waveform diagram illustrating the operation of the programmable frequency divider in FIG. 3A;

FIG. 7 is a block diagram illustrating a variation of the programmable frequency divider in FIG. 2;

FIG. 8 is a waveform diagram illustrating the operation of the programmable frequency divider in FIG. 7;

DETAILED DESCRIPTION OF THE INVENTION

Embodiments of the invention will be described with reference to the attached drawings.

Figure 1:
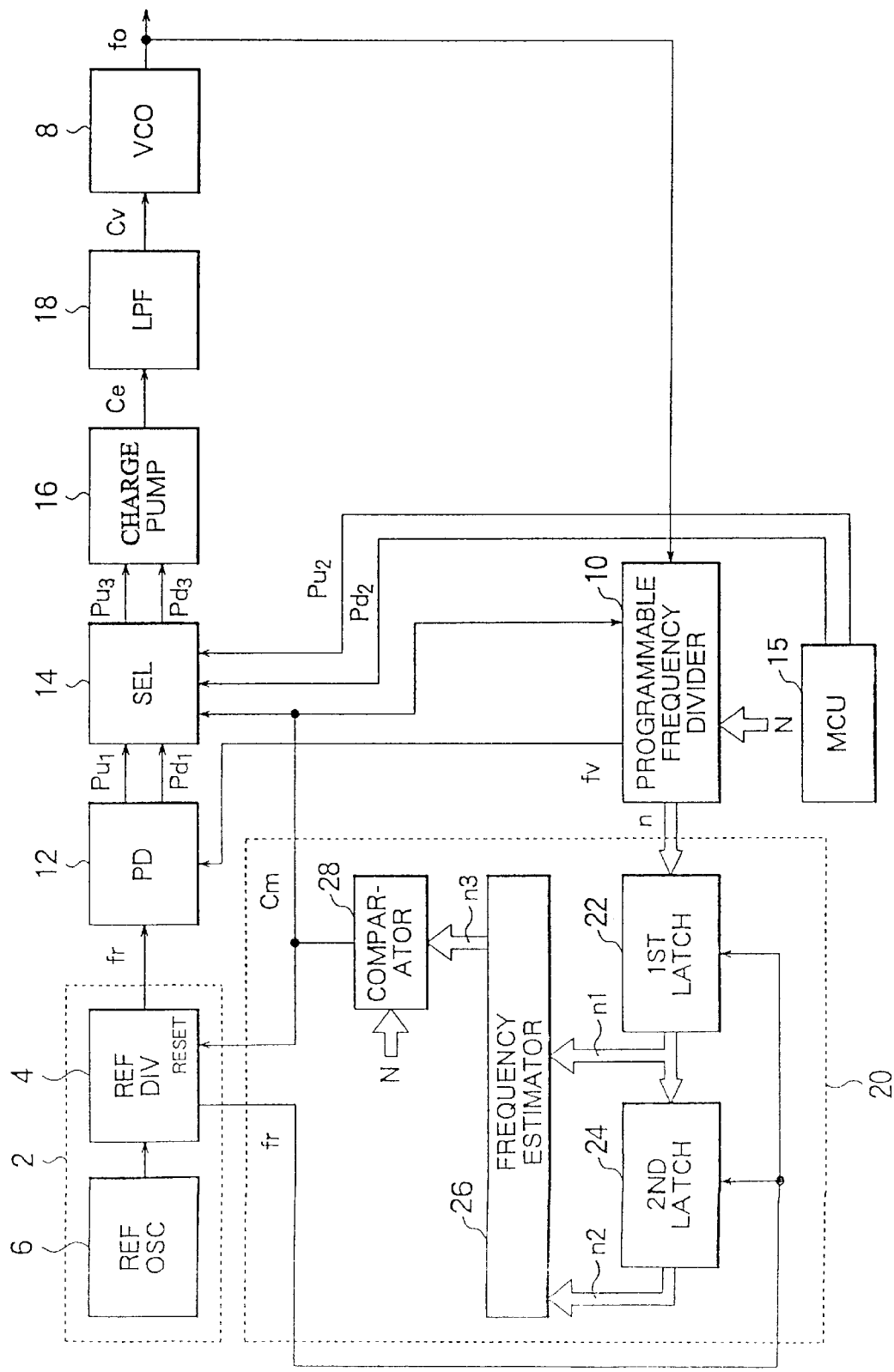
FIG. 1 is a block diagram illustrating a first embodiment of the invention.

Referring to FIG. 1, the first embodiment is a PLL having a reference signal generator 2 in which a reference divider (REF DIV) 4 divides the output frequency of a reference oscillator (REF OSC) 6 by a fixed ratio to produce a reference signal fr having a constant frequency. A voltage-controlled oscillator (VCO) 8 generates an output signal fo with a variable frequency controlled by a control voltage Cv. This output signal fo, which is the output signal of the PLL, is also supplied to a programmable frequency divider 10.

The programmable frequency divider 10 is operable in two modes, as selected by a mode control signal Cm. In the first mode (Cm high), the programmable frequency divider 10 operates as a free-running counter, counting cycles of fo and generating a count value (n). In the second mode (Cm low), the programmable frequency divider 10 divides the frequency of fo by a programmable quantity N (for example, an integer such as one hundred) to generate a feedback signal fv, which is supplied to a phase detector (PD) 12.

The phase detector 12 compares the reference signal fr and feedback signal fv, and generates two error signals, $Pu_1$ (pump-up) and $Pd_1$ (pump-down), both of which are active low. $Pu_1$ is activated when the feedback signal fv lags the reference signal fr in frequency or phase, going low from the rising edge of fr to the rising edge of fv, for example. $Pd_1$ is activated when the feedback signal fv leads the reference signal fr in frequency or phase, going low from the rising edge of fv to the rising edge of fr, for example. Only one of the two error signals $Pu_1$ and $Pd_1$ is active at a time. When fr and fv are locked in frequency and phase, $Pu_1$ and $Pd_1$ both remain inactive (high).

The error signals $Pu_1$ and $Pd_1$ are supplied to a selector control circuit 14 that receives a similar pair of signals $Pu_2$ and $Pd_2$ from a control unit such as a microcontroller unit (MCU) 15. The selector control circuit 14 also receives the mode control signal Cm, selects $Pu_1$ and $Pd_1$ when Cm is low, selects $Pu_2$ and $Pd_2$ when Cm is high, and supplies the selected pair of signals as control signals $Pu_3$ and $Pd_3$ to a charge pump 16.

The charge pump 16 generates an error current signal Ce that is positive when Pu is active, negative when Pd is active, and in the high-impedance state when Pu and Pd are both inactive. The error current signal Ce charges and discharges a capacitor (not visible) in a low-pass filter (LPF) 18, thus raising and lowering the output voltage of the low-pass filter 18. This output voltage is the control voltage Cv supplied to the VCO 8.

The mode control signal Cm is generated by a frequency detection circuit 20 comprising a first latch 22, a second latch 24, a frequency estimator 26, and a comparator 28. The first latch 22 latches the count (n) output by the programmable frequency divider 10 at rising edges of the reference signal fr. The second latch 24 latches the contents of the first latch 22 at rising edges of the reference signal fr. The frequency estimator 26 takes the difference between the contents ($n_1$) of the first latch 22 and the contents ($n_2$) of the second latch 24, thereby determining the number of cycles $n_3$ of the output signal fo in one cycle of the reference signal fr. Operating according to settings made by the MCU 15, the comparator 28 compares $n_3$ with the programmable frequency division ratio N, and generates the mode control signal Cm. The mode control signal Cm is supplied to the programmable frequency divider 10 and selector control circuit 14 as noted above, and as a reset signal to the reference divider 4.

The frequency division ratio N is programmed by the MCU 15 in response to, for example, manual input from frequency selection buttons (not visible) on a radio receiver, or instructions transmitted from a base station in a wireless communication system.

Next, the operation of the first embodiment will be described. The symbols fr, fo, and fv denoting the reference, output, and feedback signals will occasionally also be used to denote the frequencies of these signals.

When the mode control signal Cm is low and the PLL is in the locked state, the output frequency is N times the reference frequency. For example, if N is one hundred (N=100) and the reference frequency is ten kilohertz (fr=10 kHz), then the output frequency is one megahertz (fo=1 MHz), and the feedback frequency fv is 10 kHz, matching the reference frequency fr.

The error signals $Pu_1$ and $Pd_1$ generated by the phase detector 12, supplied through the selector control circuit 14 to the charge pump 16, operate to keep the feedback signal fv locked in frequency and phase with the reference signal fr. For example, if the feedback signal fv begins to lag the reference signal fr, then the pump-up error signals $Pu_1$ and $Pu_3$ go low for part of each cycle of the reference signal fr, causing the charge pump 16 to supply charge to the low-pass filter 18, thereby raising the control voltage Cv, increasing the output frequency fo, and moving the feedback signal fv back into lock with the reference signal fr.

If the desired output frequency is changed to, for example, two megahertz (2 MHz), the MCU 15 calculates that the frequency division ratio N must be increased from one hundred to two hundred (N=200), and sets this value of N in the programmable frequency divider 10. Since N has been increased, the MCU 15 activates the $Pu_2$ signal ($Pu_2$ goes low), deactivates $Pd_2$ ($Pd_2$ goes high), and sets the comparator 28 to output a high mode control signal Cm as long as $n_3$ is less than N.

Cm immediately goes high, causing the selector control circuit 14 to select $Pu_2$ and $Pd_2$ for output as control signals $Pu_3$ and $Pd_3$. $Pu_2$ and hence $Pu_3$ are continuously active, so the charge pump 16 supplies charge continuously to the low-pass filter 18, and the output frequency fo begins to rise rapidly.

In addition, since Cm is high, the programmable frequency divider 10 begins to operate as a free-running counter. Following the next complete cycle of the reference signal fr, the frequency estimator 26 takes the difference between the count value ($n_1$) at the end of the cycle, latched in the first latch 22, and the count value ($n_2$) at the beginning of the cycle, latched in the second latch 24, and obtains a value of, for example, one hundred fifty ($n_3$=150). Although the programmable frequency divider 10 is not operating as a frequency divider, $n_3$ is nevertheless a frequency division ratio, giving an estimate of the frequency of the output signal fo divided by the frequency of the reference signal fr. The comparator 28 compares this measured frequency division ratio ($n_3$) with the desired frequency division ratio (N). Since $n_3$ is still less than N, the mode control signal Cm remains high, and the selector control circuit 14 continues to hold control signal $Pu_3$ in the continuously active state.

At the end of the next cycle of the reference signal fr, the frequency estimator 26 again takes the difference between counts $n_1$ and $n_2$, now obtaining, for example, a frequency division ratio $n_3$ of two hundred. Comparing $n_3$ with N, the comparator 28 finds that $n_3$ is not less than N, and drives the mode control signal Cm to the low level. The error signals $Pu_1$ and $Pd_1$ output by the phase detector 12 now begin to control the VCO frequency through the selector control circuit 14, the signals $Pu_2$ and $Pd_2$ from the MCU 15 being disregarded. At this point, the output frequency fo is close to the desired frequency (2 MHz).

The high-to-low transition of the mode signal Cm causes the programmable frequency divider 10 to stop operating as a free-running counter and begin a new counting cycle lasting just N counts. A feedback pulse fv is output at the end of these N counts, and at every N counts thereafter, the programmable frequency divider 10 thus operating as a 1/N frequency divider (N=200).

The high-to-low transition of Cm also resets the reference divider 4, so that the reference divider 4 begins a new counting cycle at the same time as the programmable frequency divider 10. The reference signal fr and feedback signal fv are therefore mutually close in both phase and frequency. From this state, a locked state is quickly reached under control of the error signals $Pu_1$ and $Pd_1$.

Next, if a lower desired output frequency such as 1.1 MHz is selected, the MCU 15 calculates that the frequency division ratio must be decreased from two hundred to one hundred ten (N=110), and sets this value of N in the programmable frequency divider 10. Since the value of N has been decreased, the MCU 15 deactivates the pump-up signal $Pu_1$, activates the pump-down signal $Pd_2$, and sets the comparator 28 to hold the mode control signal Cm high as long as the measured frequency division ratio ($n_3$) exceeds the new value of N.

Cm immediately goes high, causing the programmable frequency divider 10 to begin operating as a free-running counter, and causing the selector control circuit 14 to select $Pu_2$ and $Pd_2$. The selector control circuit 14 therefore deactivates $Pu_3$ and activates $Pd_3$. The charge pump 16 withdraws charge continuously from the low-pass filter 18, and the output frequency fo begins to fall rapidly.

Following the next complete cycle of the reference signal fr, the frequency estimator 26 takes the difference between the latched count values ($n_1$ and $n_2$) and obtains a frequency division ratio of, for example, one hundred fifty ($n_3$=150). The comparator 28 compares this value ($n_3$) with the desired value (N). Since $n_3$ still exceeds N, the mode control signal Cm remains high, and the selector control circuit 14 continues to hold $Pd_3$ in the continuously active state.

At the end of the next cycle of the reference signal fr, the frequency estimator 26 again takes the difference between counts $n_1$ and $n_2$, now obtaining, for example, a frequency division ratio $n_3$ of one hundred. Since this $n_3$ value does not exceed N, the comparator 28 drives the mode control signal Cm to the low level, allowing the error signals $Pu_1$ and $Pd_1$ output by the phase detector 12 to control the frequency of the VCO 8. At this point, the output frequency fo is less than but still close to the desired frequency (1.1 MHz). The high-to-low transition of the mode signal Cm resets the programmable frequency divider 10 and reference divider 4, so that both start counting in phase, the programmable frequency divider 10 now operating as a 1/110 frequency divider. From this state, a locked state is quickly reached under control of the error signals $Pu_1$ and $Pd_1$.

By supplying a continuous pump-up or pump-down signal during the early stages of lock acquisition, the first embodiment enables the output frequency fo to approach the desired frequency quickly.

By resetting both the reference divider 4 and the programmable frequency divider 10 at the same time, the first embodiment also enables the final stages of lock acquisition to be completed quickly.

By using the same programmable frequency divider both to measure and to divide the frequency of the VCO output signal, the first embodiment reduces hardware costs and avoids needless power dissipation.

In a variation of the first embodiment, the signals $Pu_2$ and $Pd_2$ are supplied from external sources and switched on and off under control of the MCU 15, instead of being supplied by the MCU 15 itself.

In another variation, the selector control circuit 14, the frequency detection circuit 20, or both the selector control circuit 14 and the frequency detection circuit 20 are integrated into the MCU 15.

In a further variation, the frequency detection circuit measures the frequency division ratio of the output signal on the basis of more than two latched count values.

In a still further variation, in the first mode, the programmable frequency divider 10 is reset at the beginning of each cycle of the reference signal fr.

Next, a second embodiment will be described.

Figure 2:
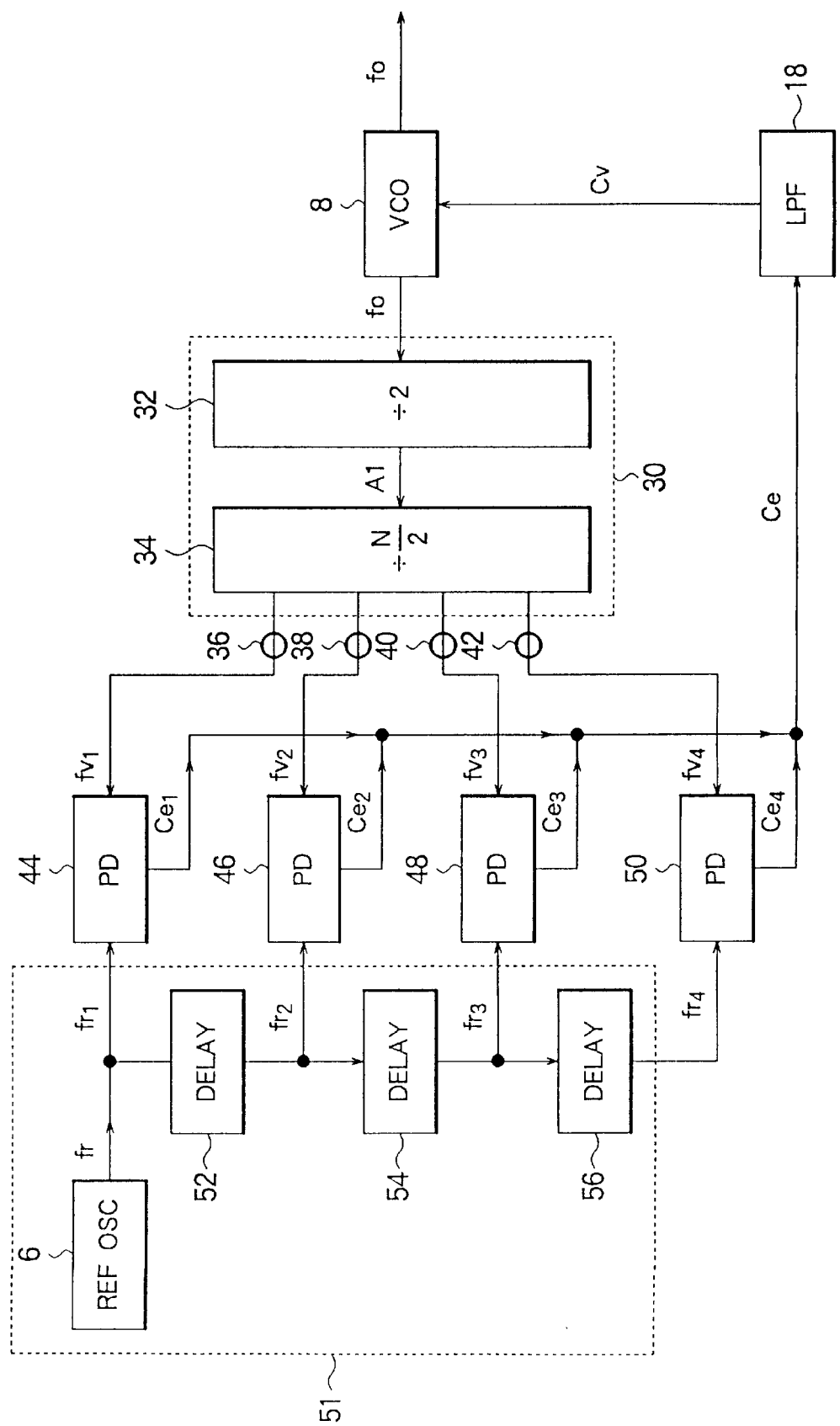
FIG. 2 is a block diagram illustrating a second embodiment of the invention.

Referring to FIG. 2, the second embodiment is a PLL frequency synthesizer comprising a VCO 8 controlled by a control voltage Cv from a low-pass filter 18. The VCO output signal fo enters a frequency divider unit 30 comprising a prescaler 32 that divides the VCO output frequency by two, and a programmable frequency divider 34 that is programmable to both integer values (N) and half-integer values (N+½). Equivalently, the programmable frequency divider 34 divides the VCO output frequency by N/2, where N is a positive integer, even values of N giving integer frequency division ratios, and odd values of N giving half-integer ratios. The equivalent notation (N/2) is used below and in the drawings. The frequency divider unit 30 as a whole then divides the VCO output frequency by N, and distributes the resulting pulses among four feedback signals $fv_1$, $fv_2$, $fv_3$, and $fv_4$, which are passed through respective gate circuits 36, 38, 40, 42 to respective phase detectors 44, 46, 48, 50.

The second embodiment also has a reference signal generator 51 comprising a reference oscillator 6 and delay circuits 52, 54, 56. The delay circuits have delay times equal to one-fourth of one cycle of the reference signal fr output by the reference oscillator 6. This signal fr is supplied as a first reference signal fr1 to the first phase detector 44, delayed in delay circuit 52 and supplied as a second reference signal $fr_2$ to the second phase detector 46, further delayed in delay circuit 54 and supplied as a third reference signal $fr_3$ to the third phase detector 48, and delayed still further in delay circuit 56 and supplied as a fourth reference signal $fr_4$ to the fourth phase detector 50.

Each of the four phase detectors 44, 46, 48, 50 is equivalent to the combination of phase detector 12 and charge pump 16 in the first embodiment. The first phase detector 44 compares $fv_1$ with $fr_1$ and generates a first error current signal $Ce_1$, the second phase detector 46 compares $fv_2$ with $fr_2$ and generates a second error current signal $Ce_2$, the third phase detector 48 compares $fv_3$ with $fr_3$ and generates a third error current signal $Ce_3$, and the fourth phase detector 50 compares $fv_4$ with $fr_4$ and generates a fourth error current signal $Ce_4$. The low-pass filter 18 receives the sum Ce of all four error current signals.

The programmable frequency divider 34, gate circuits 36, 38, 40, 42, phase detectors 44, 46, 48, 50, and delay circuits 52, 54, 56 are controlled by a control unit such as a microcontroller unit (not visible).

Figure 3A:
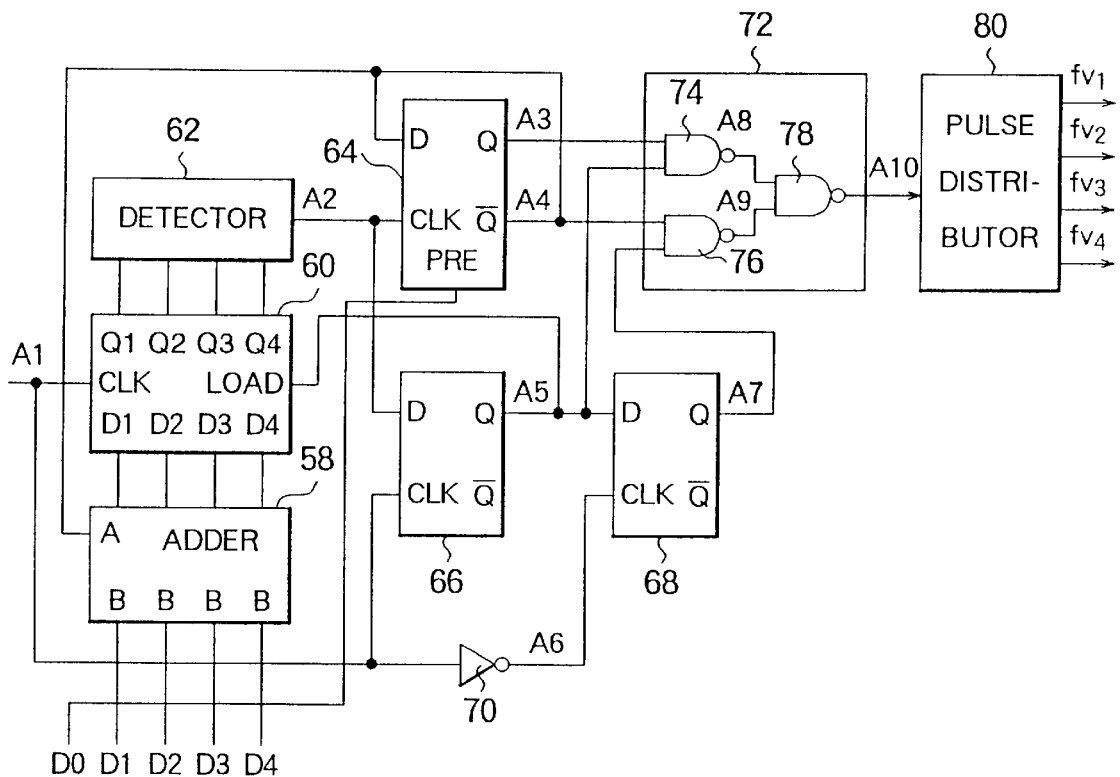
FIG. 3A is a block diagram of the programmable frequency divider in FIG. 2.

Referring to FIG. 3A, the programmable frequency divider 34 comprises an adder 58, a reloadable down-counter 60, a coincidence detector 62, D-type flip-flops 64, 66, 68, an inverter 70, a selector 72 comprising three NAND gates 74, 76, 78, and a pulse distributor 80. Reference characters A1 to A10 designate input and output signals of these circuit elements, A1 being the prescaled signal output by prescaler 32.

Adder 58 adds a one-bit input received at input terminal A to bits (D1 to D4) representing the integer part of the frequency division ratio N, which are received at input terminals B.

Down-counter 60 has clock (CLK), load, and data (D1 to D4) input terminals, and count (Q1 to Q4) output terminals. The clock input terminal receives the prescaled signal A1. The data input terminals receive the sum output by the adder 58, which is reloaded while the load input signal is high.

The coincidence detector 62 comprises logic circuits (not visible) that determine whether the count output by down-counter 60 is equal to two.

The flip-flops 64, 66, 68 have data (D) input terminals, clock (CLK) input terminals, and complementary (Q and $\overline{Q}$) output terminals. The D input is latched at rising edges of the clock input, and becomes the Q output signal. Flip-flop 64 also has a preset input terminal that receives the fraction part (bit D0) of the frequency division ratio. When the preset input is active (D0=1), the Q output of flip-flop 64 (A3) is held high, and the $\overline{Q}$ output (A4) is held low.

Selector 72 selects the Q output of either flip-flop 66 (A5) or flip-flop 68 (A7) as an internal feedback signal (A10). The selection is made according to signals A3 and A4 from flip-flop 64.

Figure 3B:
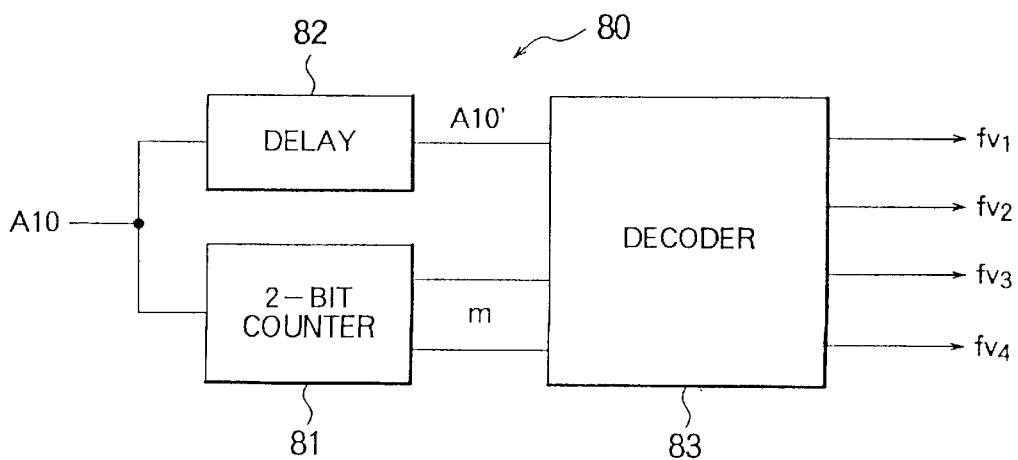
FIG. 3B is a block diagram of the pulse distributor in FIG. 3A.

Various internal structures are possible for the pulse distributor 80. FIG. 3B shows one example, comprising a two-bit up-counter 81 and a delay circuit 82 that both receive the internal feedback signal A10, and a four-line decoder 83 that decodes the count (m) output by up-counter 81 and the delayed internal feedback signal (A10') output by delay circuit 82 to generate the four feedback signals $fv_1$, $fv_2$, $fv_3$, and $fv_4$. Delay circuit 82 has a fixed propagation delay equal to or greater than the propagation delay of up-counter 81. Decoder 83 drives $fv_1$ high when A10' is high and m is '01,' drives $fv_2$ high when A10' is high and m is '10,' drives $fv_3$ high when A10' is high and m is '11,' and drives $fv_4$ high when A10' is high and m is '00.'

Next, the operation of the second embodiment will be described.

When the desired output frequency is changed, the control unit sets a new frequency division ratio N/2 in the programmable frequency divider 34. To obtain a frequency division ratio N/2 equal to 11/2, for example, the control unit sets bits D0 to D4 in FIG. 3 to the binary value '01010' (the zero value of bit D0 designates a fractional value of one-half.)

FIG. 4 illustrates the subsequent operation of the programmable frequency divider 34 by showing waveforms of signals A1 to A10 and $fv_1$ to $fv_4$, and the value of the count (n) in down-counter 60. Each time n reaches two, the detector output signal A2 goes high, toggling flip-flop output signals A3 and A4; then flip-flop output signal A5 goes high, loading the value five, if A3 is high, or six, if A3 is low, into the down-counter 60. Due to a delay (not visible) from the rise of A1 to the rising and falling edges of A5, the loaded value appears in the down-counter 60 for almost two complete A1 cycles. The count (n) thus follows a repeating pattern with a length of eleven A1 cycles (n=5, 5, 4, 3, 2, 6, 6, 5, 4, 3, 2, . . . ).

The inverted signal A6 is delayed by one-half cycle from A1, so the output signal A7 of flip-flop 68 is delayed by one-half of one A1 cycle from A5. Due to the operation of NAND gates 74 and 76, low pulses appear in signal A8 when A3 and A5 are both high, and in signal A9 when A4 and A7 are both high. These low pulses are combined by NAND gate 78 as high pulses in the internal feedback signal A10, which goes high at regular intervals equal to five and one-half (11/2) A1 cycles. The A10 pulses are distributed cyclically, with a slight propagation delay, to feedback signals $fv_1$, $fv_2$, $fv_3$, and $fv_4$ by the pulse distributor 80.

FIG. 5 illustrates the operation of the programmable frequency divider 34 when the input data bits (D0 to D4) are '11010,' corresponding to a frequency division ratio of 10/2. Since D0 is '1' (designating a fractional value of zero), A3 is held high, A4 is held low, down-counter 60 is always loaded with the value (five) of bits D1 to D4, and signal A5 is always selected for output as the internal feedback signal A10, which goes high at regular intervals of five (10/2) A1 cycles. The A10 pulses are distributed to the feedback signals $fv_1$, $fv_2$, $fv_3$, and $fv_4$ as in FIG. 4.

The prescaled signal A1 has a frequency of fo/2. The internal feedback signal A10 has a frequency fo/N (fo/2 divided by N/2). The frequency of each of the feedback signals $fv_1$, $fv_2$, $fv_3$, and $fv_4$ is fo/(4N).

Figure 6A:
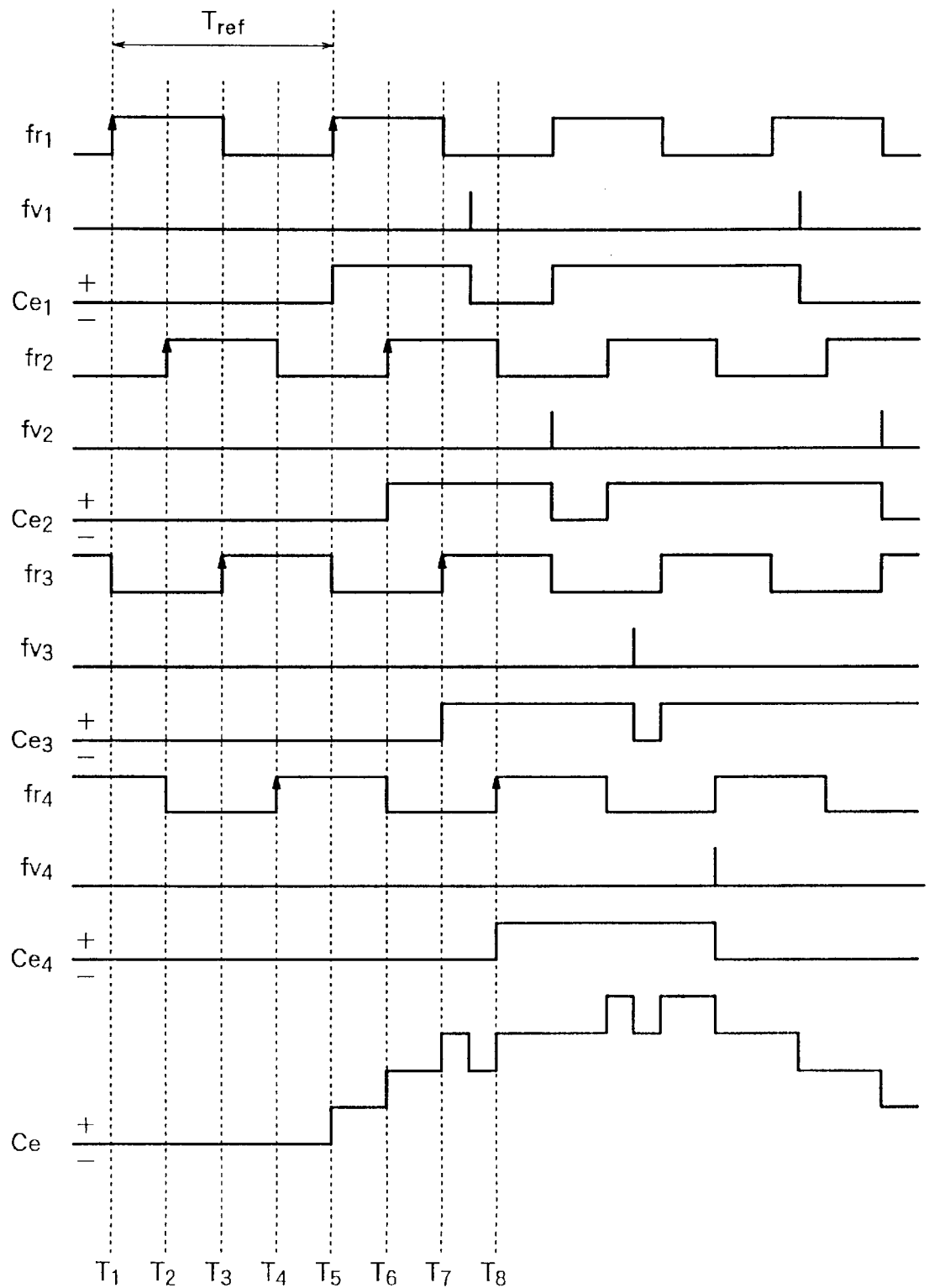
FIG. 6A is a waveform diagram illustrating the operation of the second embodiment.

FIG. 6A illustrates the operation of the second embodiment when the desired output frequency fo is increased. The control unit sets a new frequency division ratio (N/2), activates delay circuits 52, 54, 56 so that all four reference signals are produced, closes gate circuits 36, 38, 40, 42, and disables the phase detectors 44, 46, 48, 50, so that the error current signals are all in the high-impedance state. At time $T_1$, in synchronization with a rising edge of the first reference signal fr1, the control unit reloads the programmable frequency divider 34, opens the first gate circuit 36, and enables the first phase detector 44. The down-counter 60 in the programmable frequency divider 34 begins counting down at this time.

At time $T_2$, in synchronization with the following rising edge of the second reference signal $fr_2$, the control unit opens the second gate circuit 38 and enables the second phase detector 46. At time $T_3$, in synchronization with the following rising edge of the third reference signal $fr_3$, the control unit opens the third gate circuit 40 and enables the third phase detector 48. At time $T_4$, in synchronization with the following rising edge of the fourth reference signal $fr_4$, the control unit opens the fourth gate circuit 42 and enables the fourth phase detector 50.

The interval (Tref) from time $T_1$ to time $T_5$ corresponds to one cycle of the reference signal fr output by the reference oscillator 6. Reference signals $fr_1$, $fr_2$, $fr_3$, and $fr_4$ are mutually offset one-fourth cycle (Tref/4), thus by phase angles of $\pi/2$ radians. During each fr cycle, four rising edges of the various reference signals occur.

At time $T_5$, the first phase detector 44 detects that the first feedback signal $fv_1$ lags the first reference signal $fr_1$, and begins output of a positive error current signal $Ce_1$. At time $T_6$, the second phase detector 46 detects that the second feedback signal $fv_2$ lags the second reference signal $fr_2$, and begins output of a positive error current signal $Ce_2$. At time $T_7$, the third phase detector 48 detects that the third feedback signal $fv_3$ lags the third reference signal $fr_3$, and begins output of a positive error current signal $Ce_3$. At time $T_8$, the fourth phase detector 50 detects that the fourth feedback signal $fv_4$ lags the fourth reference signal $fr_4$, and begins output of a positive error current signal $Ce_4$.

Output of these positive error current signals continuous intermittently thereafter, depending on the timing relationships between rising edges of the reference signals and feedback signals. Together, the four phase detectors compare the feedback signals and reference signals four times during each cycle of the reference signal fr output by the reference oscillator 6, different phase detectors making comparisons at different timings. During the early stages of lock acquisition, the combined error current signal Ce is continuously positive and large, leading to a rapid increase in the output frequency fo.

The phase detectors 44, 46, 48, and 50 also generate signals (not visible) indicating when the locked state is reached. When lock is detected, the control unit closes gate circuits 36, 38, and 40, disables phase detectors 46, 48, 50, and disables delay circuits 52, 54, 56. The second, third, and fourth error current signals $Ce_2$, $Ce_3$, and $Ce_4$ are held in the high-impedance state. The locked state is then maintained under control of the first error current signal $Ce_1$ generated by the first phase detector 44, which continues to compare the first feedback signal $fv_1$ with the first reference signal $fr_1$.

Figure 6B:
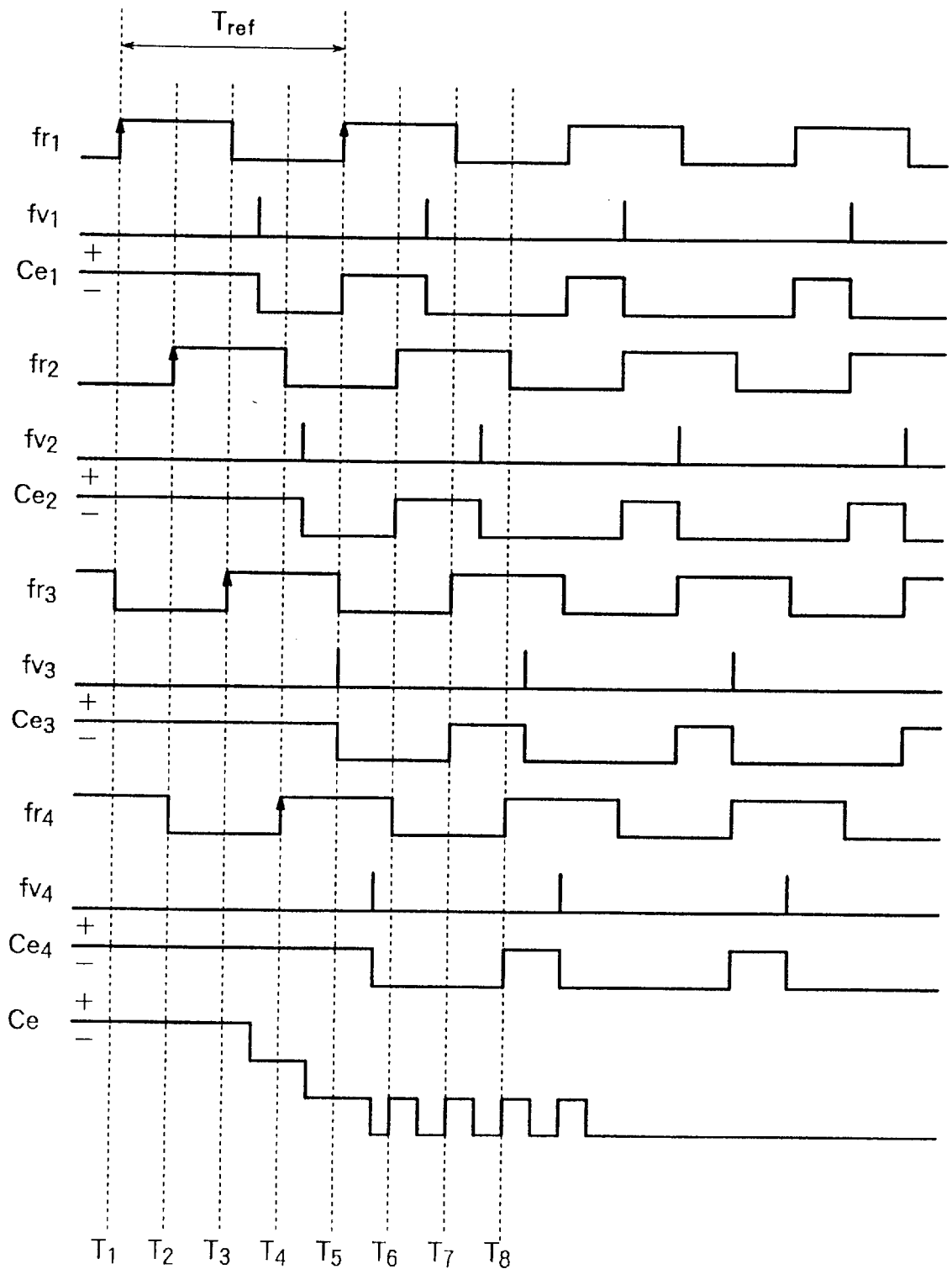
FIG. 6B is another waveform diagram illustrating the operation of the second embodiment.

FIG. 6B illustrates the operation when the frequency division ratio is decreased. Negative error current signals $Ce_1$, $Ce_2$, $Ce_3$, and $Ce_4$ are produced, starting at the initial pulses of the four feedback signals fv1, $fv_2$, $fv_3$, and $fv_4$. The combined error current signal Ce has a large negative value, causing the output frequency fo to decrease rapidly until the locked state is reached.

In the locked state, feedback frequency fo/(4N) is equal to the reference frequency fr, and the output frequency fo is equal to 4N×fr.

By using four reference signals, four feedback signals, and four error current signals, the second embodiment greatly reduces the lock-up time of the PLL.

By obtaining all four feedback signals from the same programmable frequency divider 34, the second embodiment reduces the necessary amount of hardware, as compared with a PLL employing four programmable frequency dividers.

By staggering the opening of gate circuits 36, 38, 40, and 42, the second embodiment enables the four phase detectors 44, 46, 48, and 50 to begin operating in similar phase relationships to their respective reference signals $fr_1$, $fr_2$, $fr_3$, and $fr_4$, so that all of the phase detectors generate positive error current signals, or all generate negative current error signals.

By prescaling the VCO output signal fo before input to the programmable frequency divider 34, the second embodiment reduces the power dissipation of the programmable frequency divider 34. In particular, the power dissipation of the down-counter 60 is reduced.

Similarly, the second embodiment enables the VCO output frequency to be twice the maximum operating frequency of the programmable frequency divider 34.

By employing a programmable frequency divider 34 with the capability to divide frequency by half-integer ratios (N/2), the second embodiment increases the number of output frequencies that can be generated.

In the second embodiment as described above, the available output frequencies are integer multiples of four times the reference frequency (4N×fr). The second embodiment can be modified as follows, however, to obtain arbitrary integer multiples of the reference frequency.

If data bit D0 is suitably manipulated, the programmable frequency divider 34 can be made to alternate between the operation shown in FIG. 4 and the operation shown in FIG. 5. For example, if bit D0 is manipulated so that down-counter 60 is reloaded with a value of six in one out of every eight counting cycles, and with a value of five in the other seven counting cycles, a total counting cycle with a length of forty-one A1 periods, or eighty-two fo periods, is obtained. During this total cycle, two pulses appear in each of the four feedback signals, giving each feedback signal a frequency of fo/41. Feedback frequencies from fo/42 to fo/47 can be obtained by reloading down-counter 60 with a value of six in two to seven of every eight counting cycles. Feedback frequencies of fo/M, where M is any positive integer, are obtainable in a similar way.

The necessary manipulations can be performed by the control unit, but are preferably performed in the programmable frequency divider 34 itself, by an additional circuit that, for example, uses bit D0 and the output (m) of the two-bit up-counter 81 in FIG. 3B to manipulate the A input to adder 58 and the inputs to selector 72, replacing flip-flop 64 in FIG. 3A. The required circuit modifications can be made in various ways, detailed descriptions of which will be omitted.

FIG. 7 shows a variation of the programmable frequency divider 34, in which bits D1 to D4 are supplied directly to the down-counter 60. The coincidence detector 62, flip-flops 66 and 68, inverter 70, selector 72, and pulse distributor 80 are identical to the corresponding elements in FIG. 3A, and are interconnected in the same way. Additional flip-flops 84 and 86 and an additional selector 88 are also provided. The Q output terminal of flip-flop 66 is coupled to the D input terminal of flip-flop 84, the output of which is coupled to the clock input terminal of flip-flop 86. Bit D0 is provided to the preset input terminal of flip-flop 86. The $\overline{Q}$ output of flip-flop 86 is coupled to the D input of flip-flop 86, causing flip-flop 86 to operate as a toggle flip-flop.

Selector 88 selects the $\overline{Q}$ output (A11) of flip-flop 66 or the $\overline{Q}$ output (A12) of flip-flop 84 according to the Q output (A13) and $\overline{Q}$ output of flip-flop 86. The selected signal (A14) becomes the load signal input to the down-counter 60. Reloading occurs while A14 is low. Selector 72 uses the outputs of flip-flop 86 to select the Q output (A5) of flip-flop 66 or the Q output (A7) of flip-flop 68 as the intermediate feedback signal A10.

Figure 9:
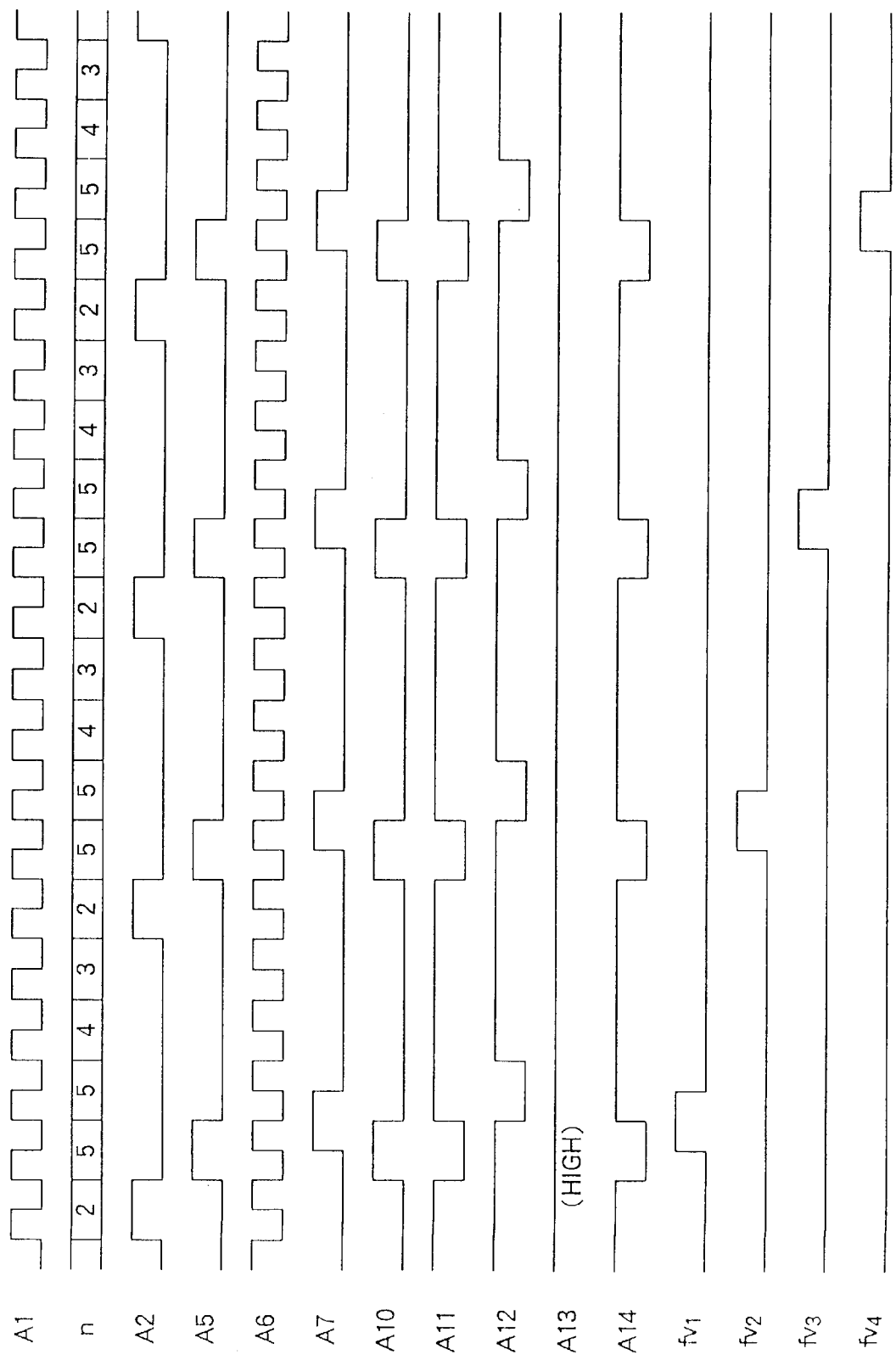
FIG. 9 is another waveform diagram illustrating the operation of the programmable frequency divider in FIG. 7.

This variation operates as illustrated in FIG. 8, which shows the case in which bit D0 is low, and FIG. 9, which shows the case in which bit D0 is high. A detailed description of the operations will be omitted, as they are similar to the operations shown in FIGS. 4 and 5. Like the circuit in FIG. 3A, the circuit in FIG. 7 generates an internal feedback signal A10 with a frequency of fo/N, and feedback signals $fv_1$, $fv_2$, $fv_3$, and $fv_4$ with frequencies of fo/(4N). This circuit can also be modified to provide feedback signals $fv_1$, $fv_2$, $fv_3$, and $fv_4$ with frequencies of fo/M, where M is an arbitrary integer, by suitable control of the inputs to selectors 72 and 88.

Incidentally, the propagation delay of inverter 70 causes a slight jitter in the internal feedback signal A10 when bit D0 is low, in the circuits in both FIGS. 3A and 7. Analysis by the inventor has shown, however, that if the propagation delay of inverter 70 does not exceed one hundred nanoseconds (100 ns), the jitter is negligible.

In another variation of the second embodiment, the prescaler 32 is omitted, enabling the reference frequency to be doubled to shorten the lock-up time.

Next, a third embodiment of the invention will be described.

Figure 10:
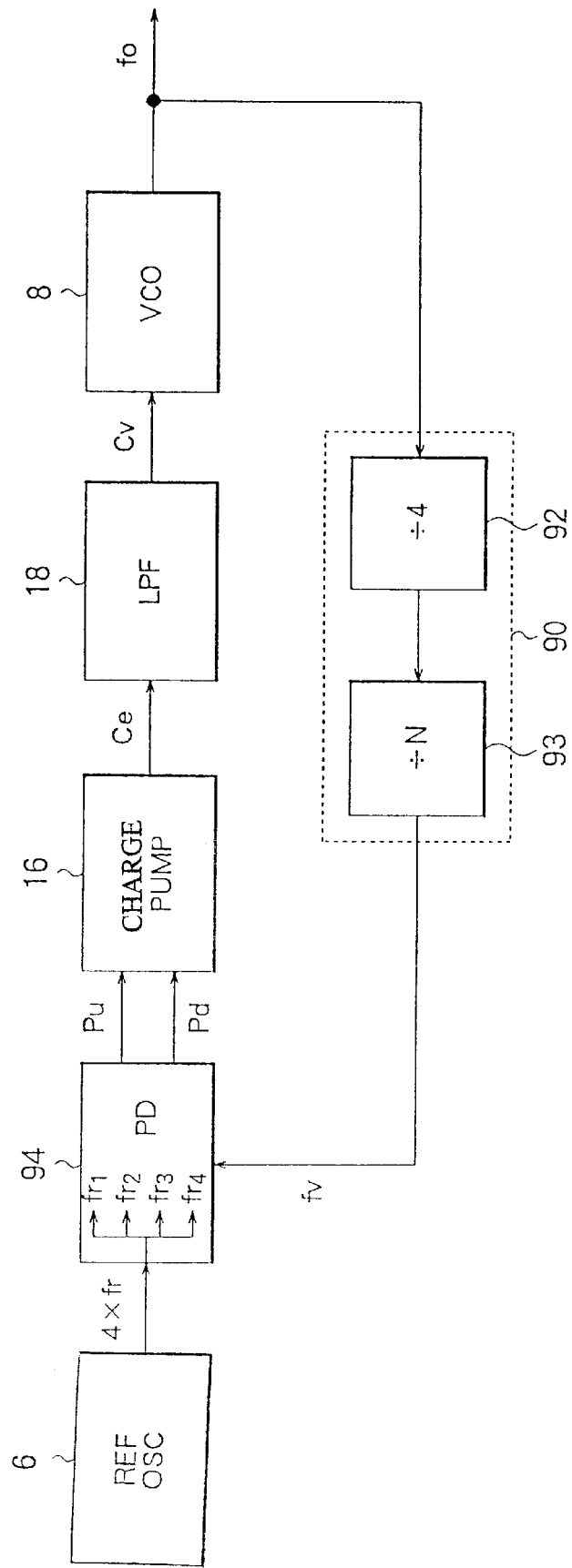
FIG. 10 is a block diagram illustrating a third embodiment of the invention.

Referring to FIG. 10, the third embodiment comprises a reference oscillator 6, a VCO 8, a charge pump 16 generating an error current signal Ce, and a low-pass filter 18 generating a control voltage Cv. The output frequency of the reference oscillator 6 is denoted 4×fr, for reasons that will be explained below.

The VCO output signal fo is supplied to a frequency divider unit 90 comprising a prescaler 92 and a programmable frequency divider 93. The prescaler 92 divides the VCO output frequency by a fixed ratio of four. The programmable frequency divider 93 divides the resulting frequency by a further ratio of N, where N is a positive integer set by a control unit such as a microcontroller unit (not visible). The frequency divider unit 90 generates a feedback signal fv with a frequency of fo/(4N).

The feedback signal fv is supplied to a phase detector 94 having an internal pulse distributor, ring counter, or the like (not visible) that generates four internal reference signals $fr_1$, $fr_2$, $fr_3$, and $fr_4$ from the reference signal (4×fr) output by the reference oscillator 6. Each internal reference signal has a frequency of fr. The phase detector 94 compares each internal reference signal with the feedback signal fv, or a delayed copy thereof, and generates pump-up (Pu) and pump-down (Pd) error signals on the basis of all four comparison results. Four comparisons are made during each period of length 1/fr.

Phase detector 94 operates as if the four phase detectors of the second embodiment were combined into a single phase detector generating a single pair of error signals. As can be understood from FIGS. 6A and 6B, during the early stages of lock acquisition, either the pump-up error signal Pu or the pump-down error signal Pd is active continuously, shortening the lock-up time. This shortening offsets the lengthening of the lock-up time due to prescaling of the feedback frequency.

By dividing the input frequency to the programmable frequency divider 93 by four, the third embodiment greatly reduces the power dissipation of the programmable frequency divider 93.

By multiplying the reference frequency by four, thereby quadrupling the number of comparisons made in the phase detector 94, the third embodiment avoids a corresponding increase in lock-up time.

In a variation of the third embodiment, the prescaler 92 divides the VCO output frequency by an arbitrary fixed positive integer P, the reference frequency is P×fr, and the phase detector 94 makes P comparisons in each period of length 1/fr.

In a further variation, the programmable frequency divider 93 has a half-integer frequency division ratio (N/2), enabling the prescaling ratio to be doubled (to 2P) to reduce power dissipation, or the reference frequency to be doubled (to 2P×fr) to shorten the lock-up time.

Next, a fourth embodiment of the invention will be described.

Figure 11:
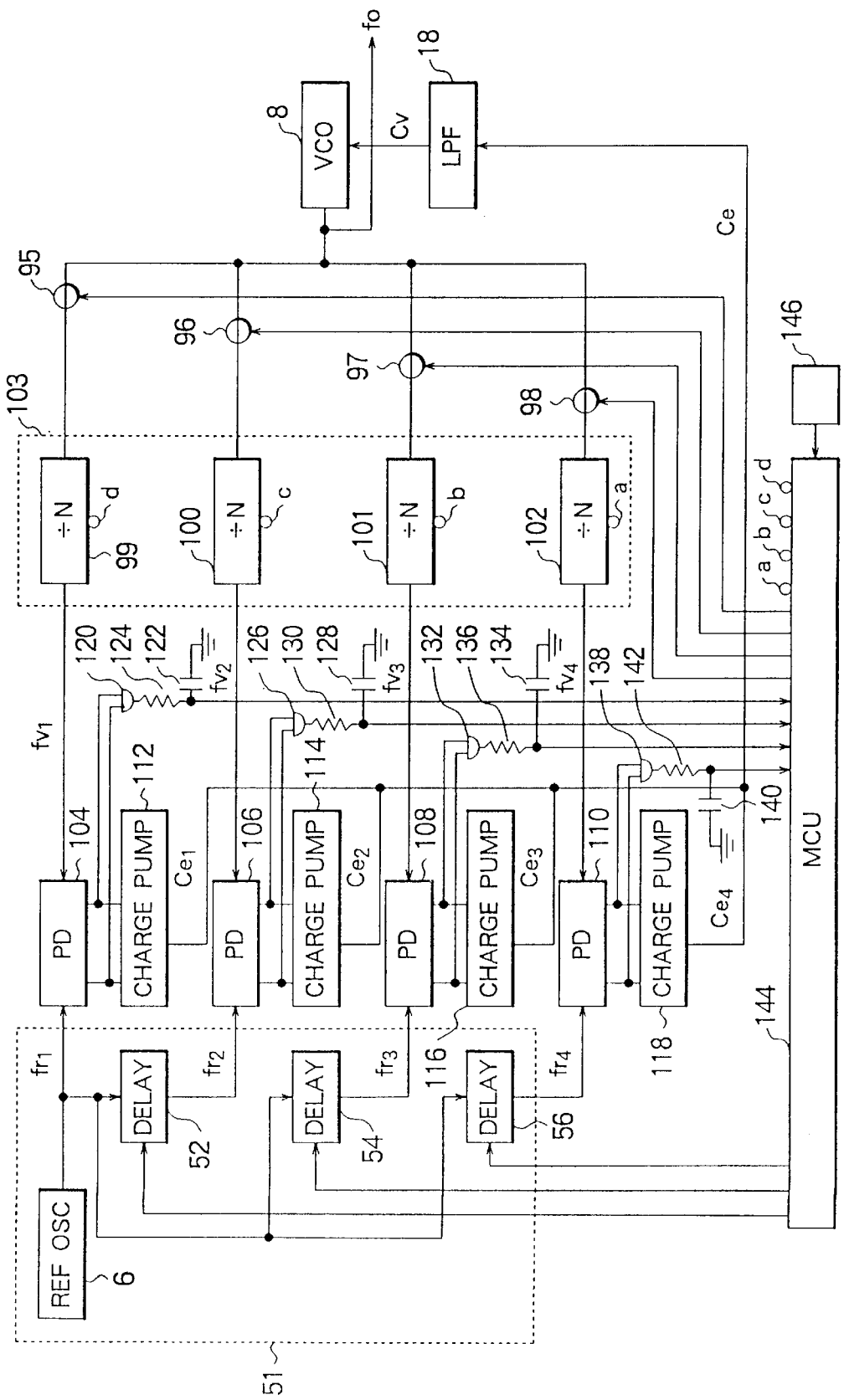
FIG. 11 is a block diagram illustrating a fourth embodiment of the invention.

Referring to FIG. 11, the fourth embodiment comprises a VCO 8, a low-pass filter 18, and a reference signal generator 51 using a reference oscillator 6 and delay circuits 52, 54, 56 to generate four reference signals $fr_1$, $fr_2$, $fr_3$, and $fr_4$.

The signal fo output from the VCO 8 is supplied through respective gate circuits 95, 96, 97, 98 to four programmable frequency dividers 99, 100, 101, 102, which divide the frequency of fo by a programmable integer N to generate four feedback signals $fv_1$, $fv_2$, $fv_3$, and $fv_4$. Each feedback signal has a frequency of fo/n. The four programmable frequency dividers 99, 100, 101, 102 constitute a frequency divider unit 103.

The feedback signals are supplied to respective phase detectors 104, 106, 108, 110, each of which generates pump-up and pump-down error signals. The pump-up and pump-down error signals are received by respective charge pumps 112, 114, 116, 118, which generate respective error current signals $Ce_1$, $Ce_2$, $Ce_3$, and $Ce_4$.

The pump-up and pump-down error signals output from phase detector 104 are supplied to an AND gate 120, the output of which charges and discharges a capacitor 122 through a resistor 124. Similarly, the error signals from phase detector 106 are supplied to an AND gate 126 that charges and discharges a capacitor 128 through a resistor 130; the error signals from phase detector 108 are supplied to an AND gate 132 that charges and discharges a capacitor 134 through a resistor 136; and the error signals from phase detector 110 are supplied to an AND gate 138 that charges and discharges a capacitor 140 through a resistor 142.

The voltages of capacitors 122, 128, 134, 140 are supplied to a control unit such as a microcontroller unit (MCU) 144. The MCU 144 also receives signals designating a desired output frequency from a panel 146 with frequency selection buttons. The MCU 144 has output ports a, b, c, d for supplying the frequency division ratio N to corresponding input ports a, b, c, d of programmable frequency dividers 99, 100, 101, 102. In addition, the MCU 144 enables and disables the delay circuits 52, 54, 56, controls the gate circuits 95, 96, 97, 98, and enables and disables the phase detectors 104, 106, 108, 110. The signal lines connecting output ports a, b, c, d of the MCU to input ports a, b, c, d of the programmable frequency dividers and the signal lines connecting the MCU to the phase detectors have been omitted to simplify the drawing.

The fourth embodiment has four feedback loops, one comprising the first programmable frequency divider 99, phase detector 104, and charge pump 112, another comprising the second programmable frequency divider 100, phase detector 106, and charge pump 114, another comprising the third programmable frequency divider 101, phase detector 108, and charge pump 116, and another comprising the fourth programmable frequency divider 102, phase detector 110, and charge pump 118.

Next, the operation of the fourth embodiment will be described. It will be assumed that the fourth embodiment is used in a superheterodyne amplitude-modulation (AM) radio receiver having an intermediate frequency of four hundred fifty kilohertz (450 kHz), receiving broadcast frequencies from 540 kHz to 1600 kHz with a channel spacing of ten kilohertz (10 kHz), which is also the oscillation frequency fr of the reference oscillator 6.

To receive the lowest-frequency (540-kHz) broadcast channel, the MCU 144 causes the PLL to produce a 990-kHz output frequency (540+450=990) by setting the frequency division ratio N to ninety-nine (99=990/10). The MCU 144 stores this value of N in an internal memory such as a random-access memory (RAM, not visible).

If the frequency selection buttons on panel 146 are now used to select the highest-frequency (1600-kHz) channel, the MCU 144 calculates that the frequency division ratio N must be changed to two hundred five (205=(1600+450)/10), and stores this new value in its internal memory. The MCU 144 also closes gate circuits 95, 96, 97, 98, enables delay circuits 52, 54, 56, disables phase detectors 104, 106, 108, 110, and sends the new value of N through ports a, b, c, d to programmable frequency dividers 99, 100, 101, 102.

By comparing the new value of N (205) with the previous value of N (99), the MCU 144 determines that the frequency division ratio has been changed by one hundred six (106=205−99). Comparing this difference (106) with a table stored in another internal memory, such as a read-only memory (ROM, not visible), the MCU 144 decides to activate all four feedback loops.

Figure 12:
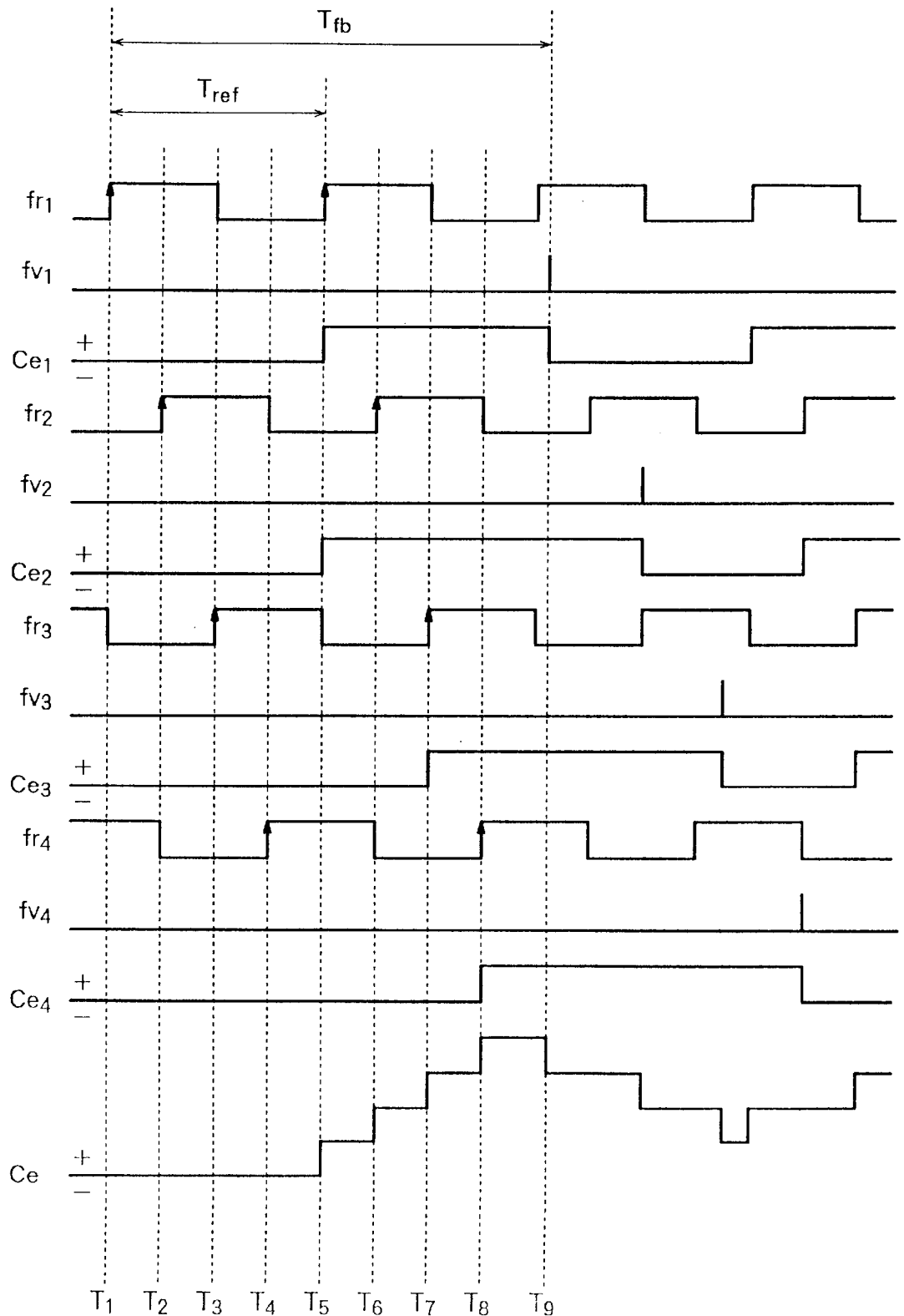
FIG. 12 is a waveform diagram illustrating the operation of the fourth embodiment.

Referring to FIG. 12, the MCU 144 opens the first gate circuit 95 and enables the first phase detector 104 in synchronization with a rising edge of the first reference signal $fr_1$ at time $T_1$. Phase detectors 106, 108, and 110 are enabled in succession at times $T_2$, $T_3$, and $T_4$, in synchronization with rising edges of reference signals $fr_2$, $fr_3$, and $fr_4$, during the same cycle of the first reference signal $fr_1$. The length of this cycle, from time $T_1$ to time $T_5$, is Tref. The four reference signals are mutually offset by Tref/4, thus by phase angles of $\pi/2$ radians.

The MCU 144 estimates the length (Tfb) of the first cycle of the first feedback signal $fv_1$ by, for example, multiplying Tref by the ratio between the new and old values of N (205/99 in the present case). The MCU 144 opens the second gate circuit 96 one-fourth of the estimated cycle length (Tfb/4) after time T1, opens the third gate circuit 97 two-fourths of the estimated cycle length (2Tfb/4) after time $T_1$, and opens the fourth gate circuit 98 three-fourths of the estimated cycle length (3Tfb/4) after time $T_1$. Each programmable frequency divider 99, 100, 101, 102 starts counting when the corresponding gate circuit is opened, causing the four feedback signals to be mutually offset by phase angles of substantially $\pi/2$.

Since the frequency division ratio N has just been increased, the first pulse of feedback signal $fv_1$ at time $T_9$ lags the rising edge of reference signal $fr_1$ at time $T_5$, causing the first phase detector 104 to generate an active (low) pump-up error signal, and the first charge pump 112 to supply a positive error current signal $Ce_1$ starting at time $T_5$. Similarly, the first pulses of feedback signals $fv_2$, $fv_3$, and $fv_4$ lag the next rising edges of reference signals $fr_2$, $fr_3$, and $fr_4$, respectively, causing phase detectors 106, 108, and 110 to generate active pump-up error signals, and charge pumps 114, 116, and 118 to supply positive error current signals $Ce_2$, $Ce_3$, and $Ce_4$ a times $T_6$, $T_7$, and $T_8$. The combined error current signal Ce causes the PLL to operate at four times the normal loop gain, rapidly increasing the output frequency of the VCO 8.

The low pump-up signals cause the outputs of AND gates 120, 126, 132, and 138 to go low, so that capacitors 122, 128, 134, and 140 are discharged toward the ground level. The MCU 144 detects the capacitor voltages as having the low logic level, and thereby detects the unlocked state of the PLL.

When one of the four capacitor voltages reaches the high logic level, indicating that both the pump-up and pump-down signals output by the corresponding phase detector are inactive (high) most of the time, the MCU 144 detects the locked state and disables all but the corresponding one of the four feedback loops. For example, if the signal from the first capacitor 122 goes high, the MCU closes gate circuits 96, 97, 98 and disables delay circuits 52, 54, 56 and phase detectors 106, 108, 110, so that the outputs of the second, third, and fourth charge pumps 114, 116, and 118 are held in the high-impedance state. The first gate circuit 95 remains open, so the locked state is maintained by the first feedback loop, comprising programmable frequency divider 99, first phase detector 104, and first charge pump 112, with normal loop gain.

Next, if the frequency selection buttons on panel 146 are used to select a 1160-kHz channel, the MCU 144 calculates that the frequency division ratio N must be changed to one hundred sixty-one (161=(1160+450)/10). Subtracting this new value from the previous value of N (205), the MCU 144 calculates a difference of forty-four (44=205−161). Comparing this value (44) with the above-mentioned table, the MCU 144 decides to activate only two feedback loops.

The MCU 144 accordingly opens the first two gate circuits 95 and 96 and enables delay circuit 52 and phase detectors 104 and 106 at suitable times, but leaves the third and fourth gate circuits 97 and 98 closed, and leaves delay circuits 54 and 56 and phase detectors 108 and 110 disabled. Operating with two feedback loops and twice the normal loop gain, the PLL reduces the output frequency and reaches a locked state, at which point the MCU 144 disables one of the two active feedback loops, leaving only one loop active.

Figure 13:
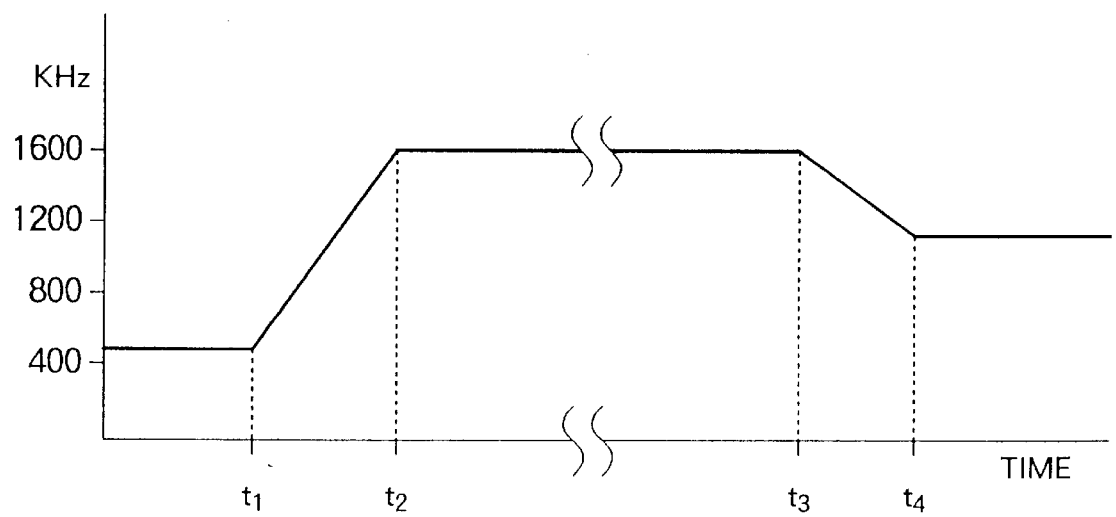
FIG. 13 is a graph illustrating the operation of the fourth embodiment.

FIG. 13 illustrates the foregoing operations of the fourth embodiment, showing time on the horizontal axis and the received frequency on the vertical axis. The lock-up time in the transition from 540-kHz reception to 1600-kHz reception is the time $t_1$ to time $t_2$. The transition from 1600-kHz reception to 1160-kHz reception takes place at a slower rate, because only two feedback loops are used, but the lock-up time from $t_3$ to time $t_4$ is substantially the same, because the frequency change is smaller.

Whenever the frequency selection is changed, the MCU 144 activates one, two, three, or four feedback loops, selecting the minimum number of feedback loops needed to achieve lock-up within a time substantially equal to the time from ti to $t_2$ in FIG. 13.

By using multiple feedback loops during medium and large frequency changes, the fourth embodiment greatly reduces the lock-up time.

By using only the minimum necessary number of feedback loops, according to the size of the frequency change, and by operating with only one feedback loop in the locked state, the fourth embodiment avoids needless power dissipation.

By selecting the first feedback loop in which lock is detected, and disabling the other feedback loops, the fourth embodiment minimizes the final phase-lock acquisition time.

In a variation of the fourth embodiment, the number of feedback loops is an arbitrary number greater than one.

Other variations of the fourth embodiment will be noted in the fifth embodiment, which is described next.

Figure 14:
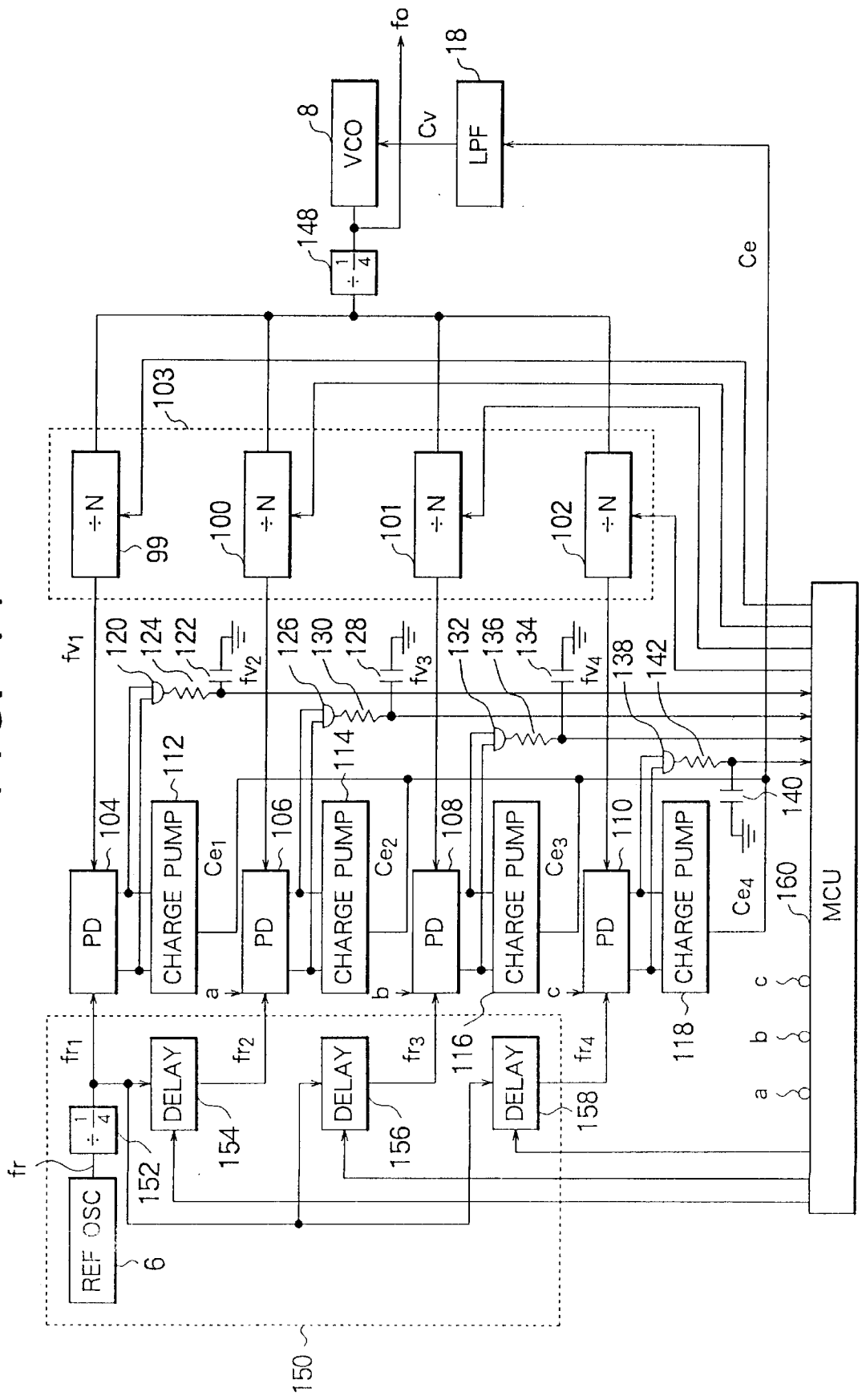
FIG. 14 is a block diagram illustrating a fifth embodiment of the invention.

Referring to FIG. 14, the fifth embodiment comprises a VCO 8 generating an output signal fo, a low-pass filter 18 generating a control voltage signal Cv that controls the VCO 8, and four programmable frequency dividers 99, 100, 101, 102 that generate respective feedback signals $fv_1$, $fv_2$, $fv_3$, $fv_4$. The four programmable frequency dividers 99, 100, 101, 102 constitute a frequency divider unit 103. Four phase detectors 104, 106, 108, 110 compare the feedback signals $fv_1$, $fv_2$, $fv_3$, $fv_4$ with respective reference signals $fr_1$, $fr_2$, $fr_3$, $fr_4$ and generate pump-up and pump-down error signals. Four charge pumps 112, 114, 116, 118 generate respective error current signals $Ce_1$, $Ce_2$, $Ce_3$, $Ce_4$ from the pump-up and pump-down error signals.

The pump-up and pump-down error signals from the first phase detector 104 are supplied to a lock detection circuit comprising an AND gate 120, which charges a capacitor 122 through a resistor 124 to generate a lock detection signal. Similarly, the pump-up and pump-down error signals from the other phase detectors 106, 108, 110 are supplied to lock detection circuits comprising AND gates 126, 132, 138, capacitors 128, 134, 140 and resistors 130, 136, 142.

A prescaler 148 disposed between the VCO 8 and the frequency divider unit 103 divides the VCO frequency (fo) by a fixed ratio of four. The prescaler 148 has a simple internal circuit structure comprising, for example, a cascaded pair of toggle flip-flops. Each programmable frequency divider 99, 100, 101, 102 divides the output frequency of the prescaler 148 by a further ratio of N. The programmable frequency dividers 99, 100, 102, 102, which operate at only one-fourth the maximum output frequency of the PLL, employ low-speed circuit elements that dissipate comparatively little power for a given operating frequency.

The reference signal generator 150 in the fifth embodiment comprises a reference oscillator 6 generating a basic reference signal fr, and a prescaler 152 that divides the frequency of fr by a fixed ratio of four to generate reference signal $fr_1$. Delay circuits 154, 156, and 158 a delay reference signal $fr_1$ by one, two, and three cycles of the basic reference signal fr to generate reference signals $fr_2$, $fr_3$, and $fr_4$. Prescaler 152 has a simple circuit configuration similar to that of prescaler 148.

A control unit such as a microcontroller unit (MCU) 160 supplies enable signals to the programmable frequency dividers 99, 100, 101, 102 and delay circuits 154, 156, 158. The MCU 160 also sets the frequency division ratio (N) in the programmable frequency dividers 99, 100, 101, 102, receives lock detection signals from capacitors 122, 128, 134, 140, and supplies enable signals (a, b, c) to the second, third, and fourth phase detectors 106, 108, 110 through signal lines that have been omitted to simplify the drawing.

Next, the operation of the fifth embodiment will be described.

When the desired output frequency is changed, the MCU 160 calculates the necessary new value of N, sets this value in the programmable frequency dividers 99, 100, 101, 102, and disables the programmable frequency dividers 99, 100, 101, 102, phase detectors 106, 108, 110, charge pumps 114, 116, 118, and delay circuits 154, 156, 158. The first phase detector 104 and first charge pump 112 remain enabled.

Figure 15:
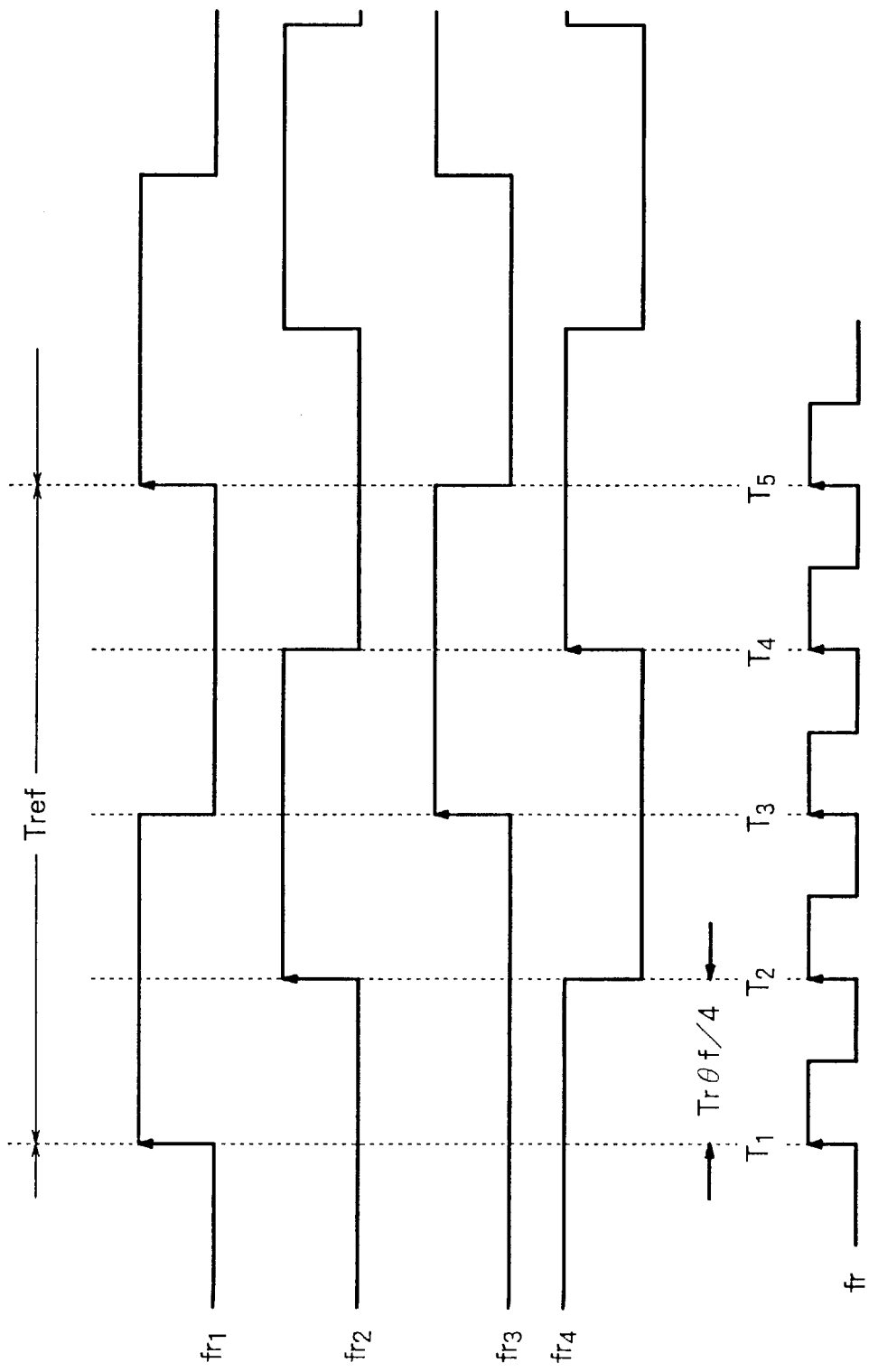
FIG. 15 is a waveform diagram illustrating the operation of the fifth embodiment.

Referring to FIG. 15, in synchronization with the next rising edge of the first reference signal $fr_1$ at time $T_1$, the MCU 160 enables the first programmable frequency divider 99. Time $T_1$ also coincides with a rising edge of the basic reference signal fr. At the next rising edge of the basic reference signal fr at time $T_2$, the MCU 160 enables the second phase detector 106 and charge pump 114. At the following rising edge of the basic reference signal fr at time $T_3$, the MCU 160 enables the third phase detector 108 and charge pump 116. At the next following rising edge of the basic reference signal fr at time $T_4$, the MCU 160 enables the fourth phase detector 110 and charge pump 118.

The four reference signals $fr_1$, $fr_2$, $fr_3$, $fr_4$ are mutually offset by intervals (Tref/4) equal to one-fourth the period (Tref) of the first reference signal fr1, thus by phase angles of $\pi/2$ radians.

The MCU 144 enables the second, third, and fourth programmable frequency dividers 100, 101, 102 following time $T_1$ at successive intervals equal to one-fourth the estimated length of the cycle of the first feedback signal $fv_1$, so that the four feedback signals $fv_1$, $fv_2$, $fv_3$, and $fv_4$ are offset by phase angles of substantially $\pi/2$ radians.

The first phase detector 104 compares the next rising edge of the first reference signal $fr_1$, which occurs at time $T_5$, with the first pulse of the first feedback signal $fv_1$, and the first charge pump 112 generates a corresponding error current signal $Ce_1$. The other phase detectors 106, 108, and 110 similarly compare reference signals $fr_2$, $fr_3$, $fr_4$ with feedback signals $fv_2$, $fv_3$, and $fv_4$, causing charge pumps 114, 116, and 118 to generate current error signals $Ce_2$, $Ce_3$, and $Ce_4$. The combined current error signal Ce, equal to the sum of $Ce_1$, $Ce_2$, $Ce_3$, and $Ce_4$, alters the control voltage Cv output by the low-pass filter 18, which controls the output frequency fo of the VCO 8 so as to bring the PLL into a new locked state.

Reference signals $fr_1$, $fr_2$, $fr_3$, and $fr_4$ have frequencies of fr/4. The output of the prescaler 148 has a frequency of fo/4. Feedback signals $fv_1$, $fv_2$, $fv_3$, and $fv_4$ have frequencies of fo/4 divided by N, or fo/(4N). In the locked state, the reference frequencies fr/4 and feedback frequencies fo/(4N) are equal, and the output frequency fo is equal to N times the basic reference frequency fr. The MCU 160 detects the locked state from the voltages of capacitors 122, 128, 134, and 140, but does not disable any of the programmable frequency dividers, delay circuits, phase detectors, and charge pumps in the locked state.

The PLL thus operates with four feedback loops both during and after lock acquisition. Since the reference and feedback frequencies are prescaled by ratios of four, the loop gain of each feedback loop is reduced by a factor of four, but since there are four feedback loops, the combined loop gain is the same as if the prescalers 149 and 152 were not present and only a single feedback loop were used. In particular, the lock-up time is the same.

The power dissipation of the frequency divider unit 103 is multiplied by a factor of four because there are four programmable frequency dividers 99, 100, 101, 102, and divided by a factor of four because each programmable frequency divider operates at only one-fourth the VC0 output frequency (fo). These factors cancel (4×¼=1), but the frequency divider unit 103 dissipates less power than a single programmable frequency divider operating at the VCO output frequency (fo), because programmable frequency dividers 99, 100, 101, 102 employ low-speed circuit elements with low intrinsic power dissipation.

For similar reasons, the total power dissipation of the phase detectors 104, 106, 108, 110 and charge pumps 112, 114, 116, 118 is equal to or less than the power dissipation of the phase detector and charge pump in a conventional PLL having only one feedback loop. Prescaler 148 dissipates relatively little power, because of its simple internal circuit structure. Prescaler 152 and delay circuits 154, 156, 158 also dissipate relatively little power, because of their simple structure and low operating frequency.

By using multiple low-gain feedback loops, the fifth embodiment thus reduces total power dissipation without reducing the total loop gain, or lengthening the lock-up time.

By directly enabling and disabling the programmable feedback circuits 99, 100, 101, and 102 instead of using gate circuits, the fifth embodiment reduces the cost of employing multiple feedback loops.

In a variation of the fifth embodiment, the MCU 144 enables the second, third, and fourth programmable frequency dividers at timings determined from the count value in the first programmable frequency divider. This variation also applies to the fourth embodiment.

In another variation of the fifth embodiment, the frequency divider unit comprises a single programmable frequency divider with multiple coincidence detectors detecting different count values, which are set by the MCU 160 to produce feedback signals with mutual phase offsets of $\pi/2$ radians. This variation also applies to the fourth embodiment.

In yet another variation of the fifth embodiment, the number of feedback loops is P, where P is an arbitrary integer greater than one, and the prescalers 148 and 152 divide by P instead of four. If P is greater than four, then further reductions in power dissipation can be achieved without changing the total loop gain or lock-up time.

In still another variation of the fifth embodiment, the number of feedback loops is not equal to the prescaling factor P, but the current-driving capability of the charge pumps, or the time constant of the low-pass filter 18, is adjusted so that the desired loop gain and lock-up time are obtained.

The embodiments described above reduce lock-up time without increasing power dissipation in the locked state, or reduce power dissipation without increasing lock-up time.

Several variations of these embodiments have been mentioned, but those skilled in the art will recognize that further variations are possible within the scope of the invention as claimed below.

What is claimed is:

1. A phase-locked loop, comprising:
   a phase detector comparing a reference signal with a feedback signal;
   a frequency divider dividing an output signal of said phase-locked loop by a predetermined frequency division ratio;
   a detection circuit detecting when the frequency division ratio of said frequency divider reaches said predetermined frequency division ratio; and
   a control circuit outputting at least a fixed pump-up signal or pump-down signal when said frequency division ratio has not reached said predetermined frequency division ratio according to an output of said detection circuit.

2. The phase-locked loop of claim 1, wherein said frequency divider is operable in a first mode, in which said frequency divider counts cycles of said output signal of said phase-locked loop and generates a count value, and a second mode, in which said frequency divider divides said output signal of said phase-locked loop by said predetermined frequency division ratio and generates said feedback signal.

3. The phase-locked loop of claim 2, wherein said frequency detection circuit measures said frequency division ratio from said count value, switches said frequency divider from said second mode to said first mode when said predetermined frequency division ratio is changed, and switches said frequency divider from said first mode to said second mode when the measured frequency division ratio reaches said predetermined frequency division ratio.

4. The phase-locked loop of claim 3, wherein said frequency detection circuit comprises:
   a first latch receiving said count value from said programmable frequency divider at timings determined by said reference signal;
   a second latch receiving said count value from said first latch at said timings determined by said reference signal;
   a frequency estimator determining said frequency division ratio from the count value held in said first latch and the count value held in said second latch; and
   a comparator comparing said frequency division ratio with said predetermined frequency division ratio.

5. The phase-locked loop of claim 2, wherein said phase detector generates a first error signal active when said feedback signal lags said reference signal, and generates a second error signal active when said feedback signal leads said reference signal, said first error signal and said second error signal controlling said output signal when said frequency divider operates in said second mode.

6. The phase-locked loop of claim 5, wherein said control circuit outputs said pump-up signal and said pump-down signal according to said first error signal and said second error signal when said frequency divider operates in said second mode.

7. The phase-locked loop of claim 1, wherein said predetermined frequency division ratio is programmable.

8. The phase-locked loop of claim 1, wherein said detection circuit resets said reference signal when said frequency division ratio reaches said predetermined frequency division ratio.

9. The phase-locked loop of claim 1, further comprising:
   a voltage-controlled oscillator generating the output signal of said phase-locked loop;
   a charge pump receiving said pump-up signal and said pump-down signal and generating an error current signal; and
   a low-pass filter receiving said error current signal and supplying a control voltage to said oscillator.

10. A phase-locked loop frequency synthesizer generating an output signal locked in phase with a reference signal, comprising:
    a frequency divider generating a feedback signal which has pulses by dividing said output signal by a frequency division ratio of N and/or N+½;
    a first phase detector comparing a phase of said feedback signal and a phase of said reference signal at a first timing and generating a first error signal;
    a second phase detector comparing a phase of said feedback signal and a phase of said reference signal at a second timing and generating a second error signal, said frequency divider comprising a pulse distributor distributing different pulses of said feedback signal to said first phase detector and said second phase detectors; and
    a voltage-controlled oscillator generating said output signal according to said first error signal and said second error signal.

11. A phase-locked loop frequency synthesizer generating an output signal locked in phase with a reference signal, comprising:
    a frequency divider generating a feedback signal by dividing said output signal by a frequency division ratio of N and/or N+½;
    a first phase detector comparing a phase of said feedback signal and a phase of said reference signal at a first timing and generating a first error signal;

a second phase detector comparing a phase of said feedback signal and a phase of said reference signal at a second timing and generating a second error signal;

a voltage-controlled oscillator generating said output signal according to said first error signal and said second error signal;

a first gate circuit coupled between said frequency divider and said first phase detector, initiating supply of said feedback signal to said first phase detector in synchronization with said first timing in a first cycle of said reference signal; and a second gate circuit coupled between said frequency divider and said second phase detector, initiating supply of said feedback signal to said second phase detector in synchronization with said second timing in said first cycle of said reference signal wherein said second gate circuit stops supplying said feedback signal to said second phase detector when said feedback signal is locked in frequency and phase with said reference signal.

12. A phase-locked loop frequency synthesizer generating an output signal locked in phase with a reference signal, comprising:

a frequency divider generating a feedback signal by dividing said output signal by a frequency division ratio of N and/or N+½;

a first phase detector comparing a phase of said feedback signal and a phase of said reference signal at a first timing and generating a first error signal;

a second phase detector comparing a phase of said feedback signal and a phase of said reference signal at a second timing and generating a second error signal; and a voltage-controlled oscillator generating said output signal according to both said first error signal and said second error signal until said output signal reaches a desired frequency, then generates said output signal according to said first error signal.

13. A phase-locked loop having a reference signal generator generating a reference signal with a fixed frequency, and an oscillator generating an output signal with a variable frequency, comprising:

a prescaler dividing said output signal by a fixed frequency division ratio, thereby generating a first feedback signal;

a frequency divider coupled to said prescaler, dividing said first feedback signal by a programmable frequency division ratio, thereby generating a second feedback signal; and a phase detector coupled to said frequency divider, generating from said reference signal at least two internal reference signals with different phases, comparing said second feedback signal with each of said internal reference signals, thereby generating a first error signal that increases the frequency of said output signal, and a second error signal that decreases the frequency of said output signal.

14. The phase-locked loop of claim 13, wherein said internal reference signals have frequencies equal to the fixed frequency of said reference signal divided by said fixed frequency division factor.

15. A phase-locked loop having an oscillator generating an output signal with a variable frequency, comprising:

a frequency divider unit dividing said output signal by a programmable frequency division ratio, thereby generating a plurality of feedback signals;

a reference signal generator generating a plurality of reference signals having different phases;

a plurality of phase detectors coupled to said frequency divider, each comparing one of said feedback signals with one of said reference signals, each thereby generating an error signal controlling the frequency of the output signal of said oscillator; and a control unit selecting a number of said phase detectors when said frequency division ratio is changed from a first ratio to a second ratio, said number depending on a difference between said first ratio and said second ratio, and enabling said number of said phase detectors.

16. The phase-locked loop of claim 15, further comprising a lock detection circuit detecting a locked state of said phase-locked loop, wherein said control unit enables Just one of said phase detectors in said locked state.

17. The phase-locked loop of claim 15, wherein said feedback signals have different phases.

* * * * *